US011495430B2

(12) United States Patent
Wallace et al.

(10) Patent No.: US 11,495,430 B2
(45) Date of Patent: Nov. 8, 2022

(54) TUNABLE EXTRACTION ASSEMBLY FOR WIDE ANGLE ION BEAM

(71) Applicant: Applied Materials, Inc., Santa Clara, CA (US)

(72) Inventors: Jay R. Wallace, Danvers, MA (US); Costel Biloiu, Rockport, MA (US); Kevin M. Daniels, Lynnfield, MA (US)

(73) Assignee: Applied Materials, Inc., Santa Clara, CA (US)

( * ) Notice: Subject to any disclaimer, the term of this patent is extended or adjusted under 35 U.S.C. 154(b) by 335 days.

(21) Appl. No.: 16/929,626

(22) Filed: Jul. 15, 2020

(65) Prior Publication Data

US 2022/0020557 A1  Jan. 20, 2022

(51) Int. Cl.
*H01J 37/08* (2006.01)
*H01J 37/04* (2006.01)

(52) U.S. Cl.
CPC ............ *H01J 37/08* (2013.01); *H01J 37/045* (2013.01)

(58) Field of Classification Search
CPC ...... H01J 37/08; H01J 37/04; H01J 37/32541; H01J 37/32422; H01J 37/3255; H01J 37/3053; H01J 37/3171; H01J 37/32357; H01J 37/32082; H01J 37/321; H01J 37/3244; H01J 37/32412; H01J 37/32568; H01J 37/32715; H01J 2237/061; H01J 2237/0815; H01J 2237/30472; H01J 2237/327; H01J 2237/151; H01J 2237/3365
See application file for complete search history.

(56) References Cited

U.S. PATENT DOCUMENTS

| 8,513,619 B1 | 8/2013 | Nasser-Ghodsi et al. |
| 9,230,773 B1 | 1/2016 | Likhanskii et al. |
| 9,293,301 B2 | 3/2016 | Biloiu et al. |
| 9,514,912 B2 | 12/2016 | Biloiu et al. |
| 10,224,181 B2 | 3/2019 | Biloiu et al. |
| 10,276,340 B1* | 4/2019 | Evans ............... H01J 37/317 |
| 10,325,752 B1* | 6/2019 | Calkins ............ H01J 37/05 |
| 10,468,226 B1* | 11/2019 | Biloiu ............. H01J 37/045 |
| 2008/0132046 A1 | 6/2008 | Walther |

(Continued)

FOREIGN PATENT DOCUMENTS

| JP | 5216918 B2 | 6/2013 |
| TW | 201611083 A | 3/2016 |

(Continued)

OTHER PUBLICATIONS

International Search Report and Written Opinion dated Sep. 29, 2021, for the International Patent Application Mo. PCT/US2021/036543, filed on Jun. 9, 2021, 8 pages.

(Continued)

*Primary Examiner* — Sean M Luck
(74) *Attorney, Agent, or Firm* — KDB Firm PLLC

(57) ABSTRACT

An ion beam processing system including a plasma chamber, a plasma plate, disposed alongside the plasma chamber, the plasma plate defining a first extraction aperture, a beam blocker, disposed within the plasma chamber and facing the extraction aperture, a blocker electrode, disposed on a surface of the beam blocker outside of the plasma chamber, and an extraction electrode disposed on a surface of the plasma plate outside of the plasma chamber.

13 Claims, 18 Drawing Sheets

(56) References Cited

U.S. PATENT DOCUMENTS

| | | |
|---|---|---|
| 2010/0255665 A1 | 10/2010 | Godet et al. |
| 2012/0104274 A1 | 5/2012 | Noel et al. |
| 2015/0371827 A1 | 12/2015 | Godet et al. |
| 2016/0071693 A1 | 3/2016 | Biloiu et al. |
| 2016/0093409 A1 | 3/2016 | Nam et al. |
| 2016/0111241 A1 | 4/2016 | Koo et al. |
| 2016/0189935 A1 | 6/2016 | Biloiu et al. |
| 2017/0042010 A1 | 2/2017 | Liang et al. |
| 2017/0178866 A1 | 6/2017 | Radovanov et al. |
| 2018/0076007 A1 | 3/2018 | Gilchrist et al. |
| 2018/0122650 A1* | 5/2018 | Ma .................. H01J 37/32623 |
| 2018/0174843 A1 | 6/2018 | Anglin et al. |
| 2019/0355581 A1* | 11/2019 | Anglin .............. H01L 21/67069 |
| 2020/0185201 A1* | 6/2020 | Kurunczi .......... H01J 37/32541 |
| 2021/0035779 A1 | 2/2021 | Biloiu et al. |

FOREIGN PATENT DOCUMENTS

| | | |
|---|---|---|
| TW | 201740441 A | 11/2017 |
| WO | 2011155917 A1 | 12/2011 |
| WO | 2015171335 A1 | 11/2015 |

OTHER PUBLICATIONS

International Search Report dated Oct. 8, 2020, for the International Patent Application No. PCT/US2020/039179, filed on Jun. 23, 2020, 4 pages.

Written Opinion dated Oct. 8, 2020, for the International Patent Application No. PCT/US2020/039179, filed on Jun. 23, 2020, 5 pages.

\* cited by examiner

TUNABLE EXTRACTION ASSEMBLY FOR WIDE ANGLE ION BEAM

FIELD

The present embodiments relate to a plasma processing apparatus, and more particularly to angled ion beams extracted from a plasma source using a novel ion extraction assembly.

BACKGROUND

Fabrication of complex 3D semiconductor structures often employs ion assisted plasma processes. Many of such processes use an ion beam having zero or small incidence angle, with respect to normal to the substrate plane. There are processes such as controlled etching of trench sidewalls, where ion beams having ion angular distributions (IAD) characterized by a high mean angle)(>50°) with respect to normal are called for. Such high incidence angles can be obtained by extracting the beam at zero degrees (with respect to the wafer normal when a wafer is oriented at a default "horizontal" orientation) and tilting the wafer at the desired angle. For example, an ion beam having a smaller cross-section than the area of a substrate to be processed may be directed to impinge generally along a normal orientation to the horizontal plane, while the tilted substrate (with respect to the horizontal plane) is scanned along the horizontal direction to expose in a sequential fashion the entirety of the substrate to the ion beam. The drawback of this approach is the process non-uniformity across the wafer surface: given the inherent beam divergence, there will be a variation in the ion beam dose as the wafer (substrate) is scanned in front of the beam.

With respect to these and other considerations the present disclosure is provided.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

An ion beam processing system in accordance with a non-limiting embodiment of the present disclosure may include a plasma chamber, a plasma plate, disposed alongside the plasma chamber, the plasma plate defining a first extraction aperture, a beam blocker, disposed within the plasma chamber and facing the extraction aperture, a blocker electrode, disposed on a surface of the beam blocker outside of the plasma chamber, and an extraction electrode disposed on a surface of the plasma plate outside of the plasma chamber.

An ion beam processing system in accordance with another non-limiting embodiment of the present disclosure may include a plasma chamber, a plasma plate formed of an electrically insulating material, disposed alongside the plasma chamber, the plasma plate defining a first extraction aperture, a beam blocker formed of an electrically insulating material, disposed within the plasma chamber and facing the extraction aperture, a blocker electrode formed of an electrically conductive material and covered by a first dielectric coating, disposed on a surface of the beam blocker outside of the plasma chamber, wherein the blocker electrode is planar and has a thickness measured in a direction perpendicular to a front surface of the beam blocker, wherein the thickness of the blocker electrode is less than 1 millimeter, an extraction electrode formed of an electrically conductive material and covered by a first dielectric coating, disposed on a surface of the plasma plate outside of the plasma chamber, wherein the extraction electrode is planar and has a thickness measured in a direction perpendicular to a front surface of the plasma plate, wherein the thickness of the extraction electrode is less than 1 millimeter; and a pulsed voltage supply electrically coupled to the plasma chamber and the extraction electrode to generate a bias voltage between the extraction electrode and the plasma chamber.

A method of manufacturing a plasma plate assembly of an ion beam processing system in accordance with a non-limiting embodiment of the present disclosure may include providing a plasma plate formed of an electrically insulating material, the plasma plate defining an elongated extraction aperture, applying an electrically conductive material to a front surface of the plasma plate surrounding the extraction aperture to form an extraction electrode, the extraction electrode being planar and having a thickness of less than 1 millimeter measured in a direction perpendicular to the front surface of the plasma plate, and applying a dielectric coating to the plasma plate and the extraction electrode, the dielectric coating covering the front surface of the plasma plate and the extraction electrode.

A method of manufacturing a blocker assembly of an ion beam processing system in accordance with a non-limiting embodiment of the present disclosure may include providing a beam blocker formed of an electrically insulating material, applying an electrically conductive material to a front surface of the beam blocker to form a blocker electrode, the blocker electrode being planar and having a thickness of less than 1 millimeter measured in a direction perpendicular to the front surface of the beam blocker, and applying a dielectric coating to the beam blocker and the blocker electrode, the dielectric coating covering the front surface of the beam blocker and the blocker electrode.

DETAILED DESCRIPTION

Figure 1:
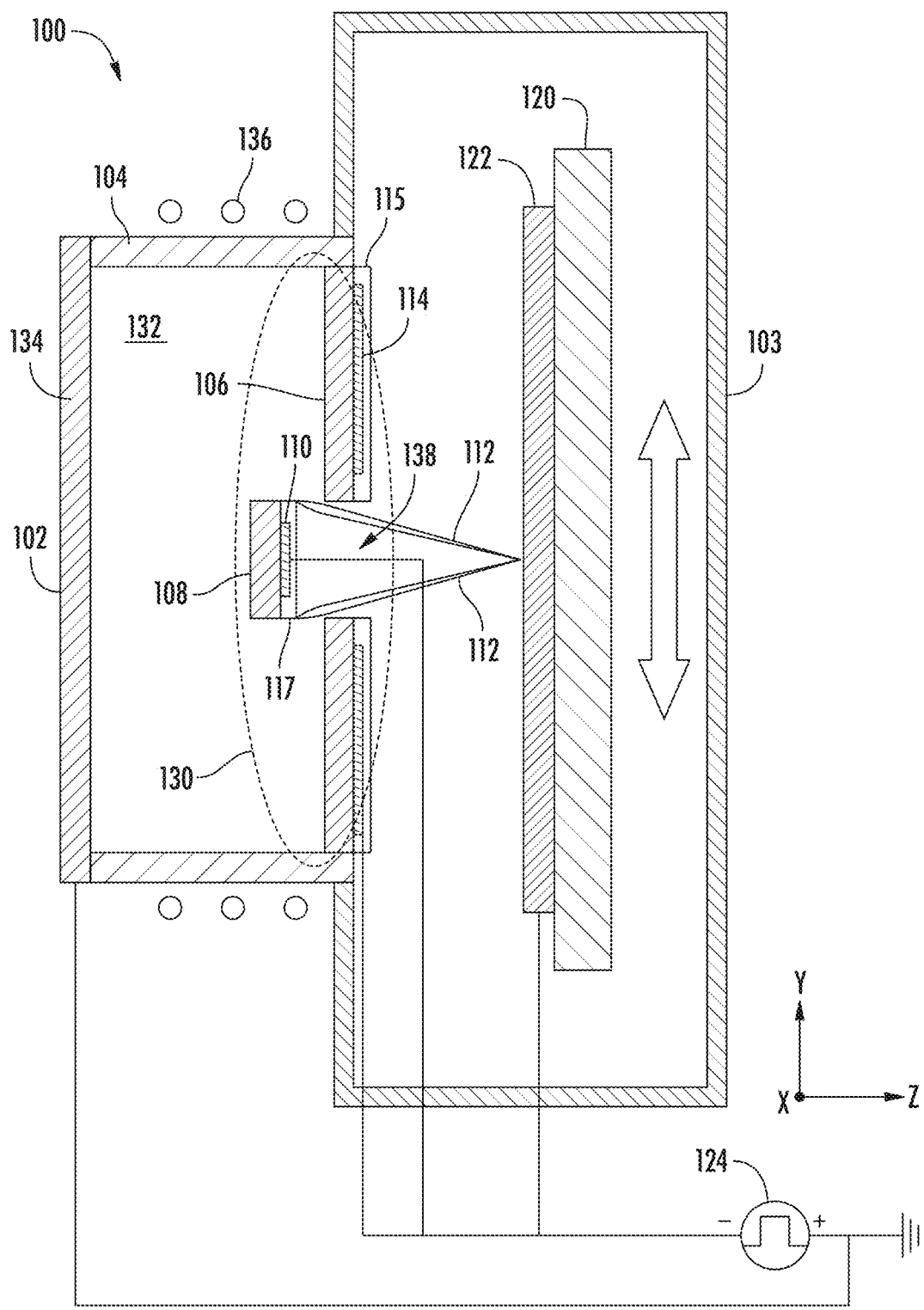
FIG. 1 presents a vertical cross-section of a processing apparatus consistent with embodiments of this disclosure.

The present embodiments will now be described more fully hereinafter with reference to the accompanying drawings, where some embodiments are shown. The subject matter of the present disclosure may be embodied in many different forms and should not be construed as limited to the embodiments set forth herein. These embodiments are provided so this disclosure will be thorough and complete, and will fully convey the scope of the subject matter to those skilled in the art. In the drawings, like numbers refer to like elements throughout.

The embodiments described herein provide systems and methods for controlling angular distribution of ions directed to a substrate using a hidden deflection electrode. In some embodiments, an apparatus is disclosed, facilitating the generation of ion beams having large on-wafer incidence angles in a compact ion beam source. In addition to extraction of ion beams having high incidence angles, the present embodiments may be used in the case of chemically reactive plasmas (feedstock gases: $C_xF_y$, $C_xH_yF_z$, $SF_6$, $H_2$, $O_2$, $Cl_2$, $I_2$, $Br_2$, and/or their mixtures) to generate ions and highly reactive radicals. In particular, ion beams ranging from a few hundred eV to a few keV, having high on-wafer incident angles (e.g., up to 45°) and beam currents of a few tens of mA may be extracted. As an example of device processing, the use of symmetrical ribbon beamlets extraction, provided by the present embodiments, allows simultaneous processing of vertical trench walls in complex semiconductor structures as a substrate is scanned parallel with an extraction assembly.

In the embodiments to follow, an ion beam processing system may include a plasma chamber and an extraction assembly. The extraction assembly may include a plasma plate, disposed along a side of the plasma chamber, where the plasma plate includes an extraction aperture. According to various embodiments of the disclosure, the plasma plate may be formed of an electrically insulating material. The extraction assembly may include a beam blocker, also formed of an electrically insulating material, disposed within the plasma chamber, while facing the extraction aperture. As such, the beam blocker may serve to divide the extraction aperture into two separate sub-apertures. The extraction assembly may include a blocker electrode, including an electrically conductive thin film disposed on a face of the beam blocker outside of the plasma chamber, as well as an extraction electrode, including of an electrically conductive thin film disposed on a face of the plasma plate outside of the plasma chamber. In particular embodiments, the blocker electrode may be covered by a first dielectric coating, covering the blocker electrode and the face of the beam blocker, and the extraction electrode may be covered by a second dielectric coating, covering the extraction electrode and the face of the beam plasma plate. As described in the embodiments to follow, this arrangement facilitates generation of high angle ion beams through the sub-apertures, where the high angled ion beams define a large angle of incidence with respect to perpendicular to a plane of the plasma plate, such as 30 degrees or greater.

The extraction aperture of the plasma plate may have an elongated shape, facilitating the extraction of a pair of ribbon ion beams, or ribbon ion beamlets and directing the ribbon ion beamlets at wide angles to a substrate, aligned parallel to the plane of the plasma plate, for example. The term "wide angle(s) to a substrate" as used herein may greater than 30 degrees with respect to a normal (perpendicular) to a plane of the substrate.

Turning now to FIG. 1, there is shown a vertical cross-section of a processing system, consistent with embodiments of this disclosure. The processing system 100 includes a plasma chamber 102, a process chamber 103, and extraction assembly 130, described in more detail below. The processing system 100 further includes a pulsed voltage supply 124, electrically coupled to generate a bias voltage between an extraction electrode 114 and the plasma chamber 102. As such, the processing system 100 acts as an ion beam processing system to generate ion beams for processing a substrate 122, arranged proximate to the extraction electrode 114. The plasma chamber 102 may act as a plasma source to generate a plasma 132 in the plasma chamber 102 by any suitable approach. For example, the plasma chamber 102 may be referenced to a ground potential through electrically conductive wall 134. Ionic (ion) species of interest may be produced in the plasma 132 by inductively coupling an rf power generated by an rf power source (not separately shown) from an rf antenna 136 to a working gas through a dielectric window 104. Other known means of generating a plasma are possible.

As shown in FIG. 1, the extraction assembly 130 may include a plasma plate 106, disposed along a side of the plasma chamber 102, where the plasma plate 106 may be formed of an electrical insulator, such as $Al_2O_3$ (alumina), quartz, AN or other suitable electrically insulating material. The plasma plate 106 may define an extraction aperture 138 elongated along the X-axis of the Cartesian coordinate system shown (note the X-axis generally extends perpendicularly into the plane of the page). As such, the extraction aperture 138 may define a space wherein ions from the plasma chamber 102 may pass. The extraction assembly 130 may further include an extraction electrode 114, formed of a thin film (e.g., up to 1 millimeter thick) of electrically conductive material disposed on a face of the plasma plate 106 outside the plasma chamber 102. The extraction electrode 114 may be covered with a first dielectric coating 115 formed a layer of chemically inert, dielectric material covering the extraction electrode 114 and the face of the plasma plate 106. Collectively, the plasma plate 106, extraction electrode 114, and first dielectric coating 115 may be referred to as "the plasma plate assembly."

The extraction assembly 130 may also include a beam blocker 108, formed, for example, of an insulating material. In the arrangement of FIG. 1, when a negative voltage is applied to the substrate 122 (or to a substrate plate 120) with respect to the plasma chamber 102 in the presence of the plasma 132, plasma menisci are formed in the slits (sub-apertures), formed between the extraction aperture 138 and the beam blocker 108. In various embodiments, the beam blocker 108 may be arranged symmetrically above the extraction aperture 138 to allow formation and extraction of two symmetrical ion beamlets 112. Ion beam processing of the substrate 122 takes place by scanning the substrate 122 in the y direction and, may also include by rotating the substrate around the Z-axis. In various non-limiting embodiments, depending on the electrical conductivity of the substrate 122 (thick or thin oxide), the ion beamlets 112 may be extracted as pulsed ion beams, where a pulsing frequency and the duty cycle may be adjusted to a target value in the 10-50 kHz range, and 10-100% range, respectively, so the substrate does not charge-up. Advantageously, the use of dielectric materials for the extraction electrode 114 and beam blocker 108 facilitates use in highly reactive plasmas used to generate ionic and radical species.

The extraction assembly 130 may also include a biasable blocker electrode 110. As illustrated in FIG. 1, the blocker electrode 110 is formed of a thin film (e.g., up to 1 millimeter thick) of electrically conductive material disposed on a face of the beam blocker 108, outside the plasma chamber 102. The blocker electrode 110 may be covered with a second dielectric coating 117 formed a layer of chemically inert, dielectric material covering the blocker electrode 110 and the face of the beam blocker 108. Collectively, the beam blocker 108, blocker electrode 110, and second dielectric coating 117 may be referred to as "the blocker assembly." As illustrated generally in FIG. 1, the beam blocker 108 and plasma plate 106, while not co-planar, may be deemed to define the border between the inside of the plasma chamber 102 and outside of the plasma chamber 102 on the lower side. Thus, the blocker electrode 110, whether disposed above the plasma plate 106 or not, may be deemed to lie on the outside of the plasma chamber 102.

In some non-limiting embodiments, the height of the extraction aperture 138 along the y-direction may be variable. In various embodiments of the disclosure, the plasma plate 106, extraction electrode 114, and substrate 122 may be mutually parallel to one another and may lie parallel to the X-Y plane. Thus, the plane of the plasma plate 106 may be deemed to be a plane parallel to the X-Y plane, and generally parallel to the scan direction (y-direction) of the substrate 122.

The extraction aperture 138 may be aligned in a symmetric manner with respect to the blocker electrode 110 and beam blocker 108, so a symmetry of the two ion beamlets 112 extracted from the slits between the beam blocker 108 and plasma plate 106 is established. In some embodiments, the beam blocker 108, the blocker electrode 110, and the extraction aperture 138 may be elongated so as to extend in x direction for 350 mm-400 mm so uniform ribbon beamlets of 300 mm width (in the x-direction) can be extracted.

According to various non-limiting embodiments, the biasable elements of the extraction assembly 130, such as blocker electrode 110 and extraction electrode 114, may be set at the same electrical potential as the substrate 122. The configuration means the substrate 122 is advantageously not part of the extraction assembly 130. In particular, because the substrate 122 is at the same potential as the blocker electrode 110 and extraction electrode 114, there is no potential difference and consequently no electric field between the substrate 122 and the extraction electrode 114 or blocker electrode 110.

Thus, the relative position of the substrate 122 with respect to the extraction assembly 130, such as extraction electrode 114 and plasma plate 106, does not affect ion angular distribution of ion beams extracted through extraction assembly 130. Under this condition the substrate location along the Z-axis can be varied from 5 mm to more than 20 mm so plasma chamber contamination with material sputtered and/or chemically etched from the substrate can be diminished considerably. In other words, when needed, the substrate may be located at a larger separation from the extraction assembly along the Z-axis to reduce contamination, since contamination decreases as the solid angle the extraction apertures "see" the wafer becomes smaller as the separation is increased.

To be electrically biasable, the blocker electrode 110 and the extraction electrode 114 may be constructed of thin films (e.g., up to 1 millimeter thick in the z-direction) of electrically conductive materials (e.g., metals, such as aluminum, titanium, copper, molybdenum, tungsten, an doped silicon may be used for these components in some non-limiting embodiments), as noted above. Because these parts are not exposed to ion beam bombardment, as detailed below, metal contamination is reduced. According to some embodiments, for a fuller protection against contamination, the electrically biasable parts may be coated with a thin dielectric film surrounding an inner body or portion formed of an electrically conductive material. In one nonlimiting embodiment, a suitable dielectric coating is made of a mixture of yttrium, aluminum, and zirconium oxides, and has a thickness of 100 micrometers. Such dielectric material is known to provide resistance against etching. In other embodiments, $Al_2O_3$, AlFO, yttrium oxide ($Y_2O_3$), or zirconium oxide ($ZrO_2$) or a combination of them may be used as a dielectric coating.

As is known, the shape and location of a plasma meniscus and the mechanism of ion beam extraction depends on the relative values of the plasma density in a plasma, such as plasma 132, and further depends on the extraction electric field. When non-electrically conductive materials, such as dielectrics, are used to make the components of an ion extraction assembly, the physics for ion beam extraction changes considerably. This change happens because the plasma sheath, which sheath is the interface between the plasma 132 and the walls of the ion extraction assembly (in the present embodiments, the beam blocker 108 and plasma plate 106) is a function of the nature of the wall: insulating or conducting. For pulsed plasmas for which pulsing frequency (f) is higher than ion plasma frequency ($f_{pi}$)

$$f_{pi} = \frac{1}{2\pi}\left(\frac{ne^2}{\varepsilon_0 m_i}\right)^{\frac{1}{2}} \tag{1}$$

where n, $\varepsilon_0$, and $m_i$ are the plasma density, elementary charge, dielectric constant of vacuum, and ion mass, we have the so-called matrix sheath, ions are immobile and electrons are pushed away from the wall. In this case the sheath thickness is given by $$s = \lambda_D \left(\frac{2eV_o}{k_B T_e}\right)^{\frac{1}{2}} \tag{2}$$

where, $V_0$, $k_B$, and $T_e$ stand for voltage drop across the sheath, Boltzmann constant, and electron temperature, respectively. The quantity denoted by $\lambda_D$ is Debye length given by $$\lambda_D = \left(\frac{\varepsilon_0 k_B T_e}{ne^2}\right)^{\frac{1}{2}} \tag{3}$$

Depending on the value of the voltage on the wall, in the case of matrix sheath, the sheath thickness can range from tens to hundredth of Debye lengths. For usual plasma densities between $5\times10^9$ and $5\times10^{11}$ cm$^{-3}$ the ion plasma frequency is between 2 MHz and 25 MHz much higher than pulsing frequency of the extraction voltage (10 to 50 kHz). In this case ions have enough time to be accelerated by the electric field in the sheath and assuming their motion is collisionless, the sheath thickness is given by Child's law:

$$s = \frac{\sqrt{2}}{3}\lambda_D\left(\frac{2eV_o}{k_BT_e}\right)^{\frac{3}{4}} \quad (4)$$

Assuming an electron temperature of 3.5 eV the sheath thickness increases with voltage and with the inverse of plasma density and for ranges of interest varies from few fractions of millimeter to approximately 20 millimeters.

In accordance with various embodiments, the ion beams of the present embodiments may be extracted as pulsed ion beams, as noted above. The extraction voltage system may, for example, include a pulse component, such as circuitry to pulse an extraction voltage on and off according to a targeted pulse period and duty cycle. In the case of small ion beam currents, the pulsing duty cycle may be 100%, i.e., continuous ion extraction. In particular, the pulse period and duty cycle may be arranged to facilitate extraction of angled ion beams as discussed below. Because the beam blocker 108 and plasma plate 106 components may be formed of dielectric material, the pulsing of an ion beam may be arranged to take into account the time-dependent evolution of plasma sheaths.

Figure 2A:
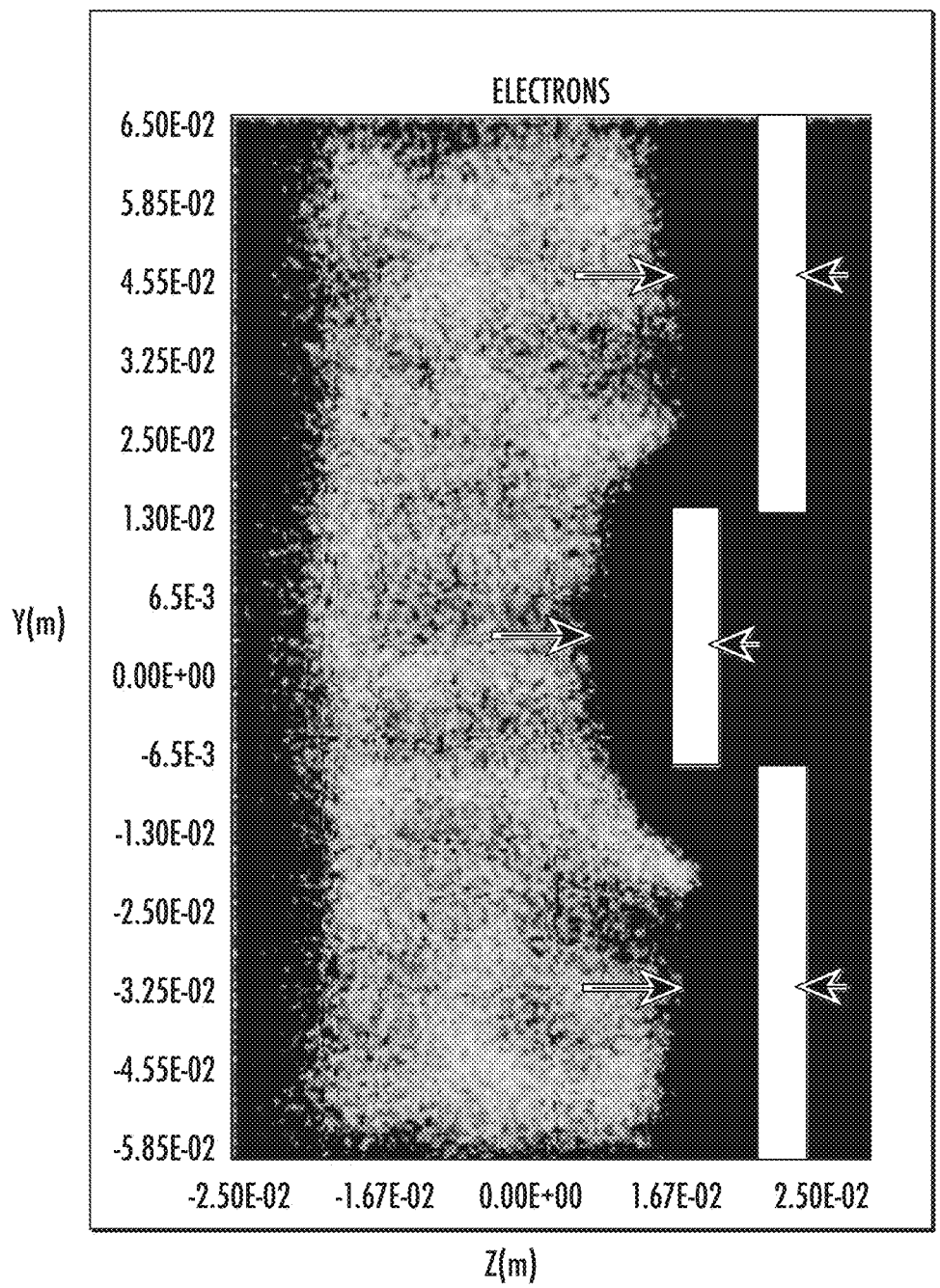
FIGS. 2A-2D depict collectively, the evolution of electron and ion distributions as a function of time, in accordance with embodiments of the disclosure.
Figure 2B:
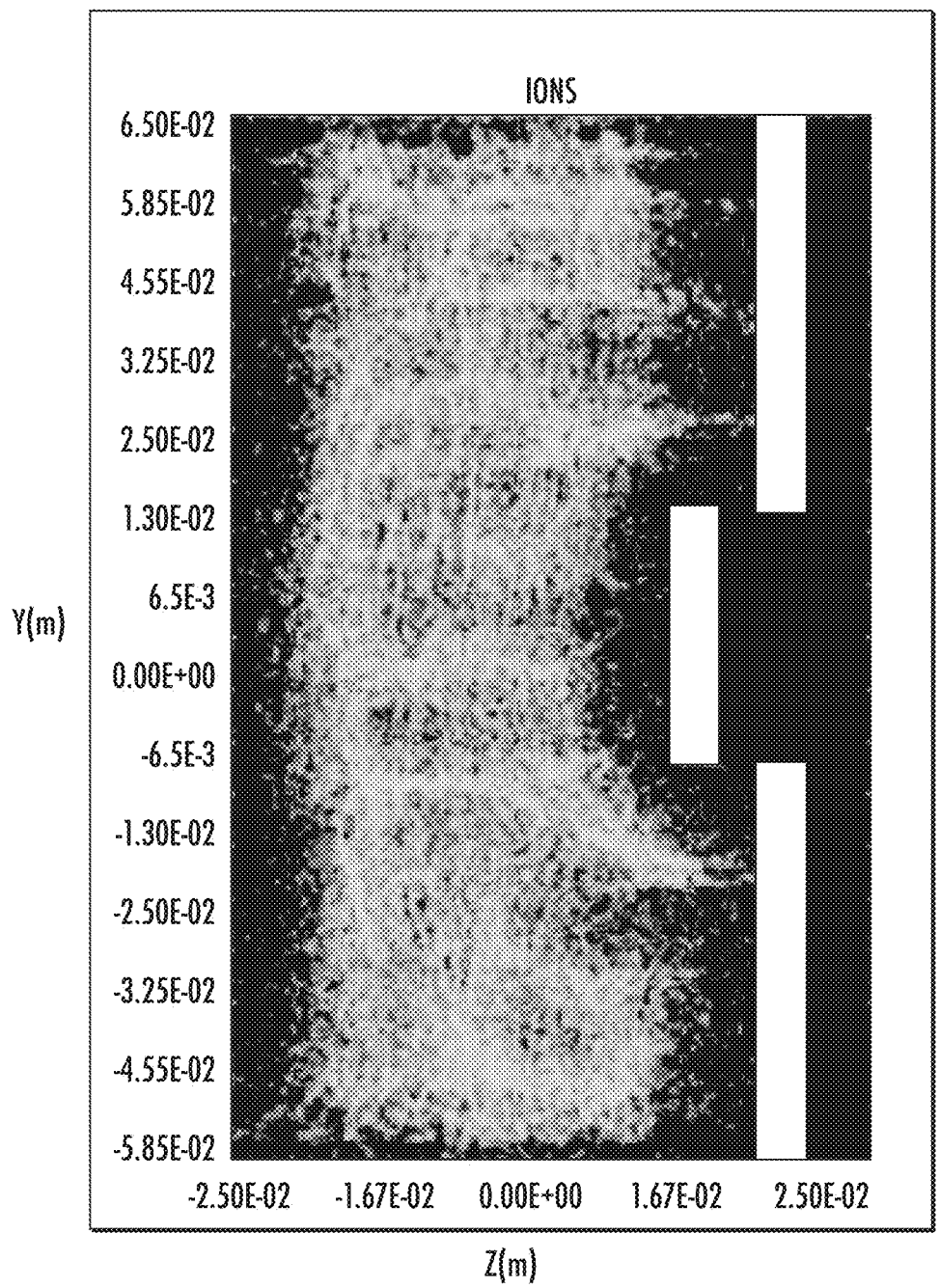

Turning to FIGS. 2A-2D the evolution of electron and ion distributions as a function of time is shown in Z-Y space, in accordance with embodiments of the disclosure. In the simulation shown, the voltage on a substrate (wherein the position is represented by the vertical line at z=2.5 cm) is pulsed at −1 kV voltage with a 20 kHz pulsing frequency and 50% duty cycle. The beam blocker and plasma plate components are shown schematically as the bright vertically elongated rectangles. The beam blocker and plasma plate are modeled as made of dielectric material (quartz), wherein the material is allowed to charge up electrostatically. The FIGS. 2A and 2B show electron and ion distributions, respectively, at 1 μs after start of an applied negative voltage pulse. Because the quartz allows transmission of electric field lines, at the beginning of a pulse (1 μsec) a high voltage drop occurs on the sheath, consequently developing a sheath of considerable thickens (~6 mm). The electric field in the vicinity of extraction slit is oriented perpendicularly to the plasma plate and beam blocker (along the z-direction) and as a result very few, if any, ions are extracted (see ion distribution in FIG. 2B).

Figure 2C:
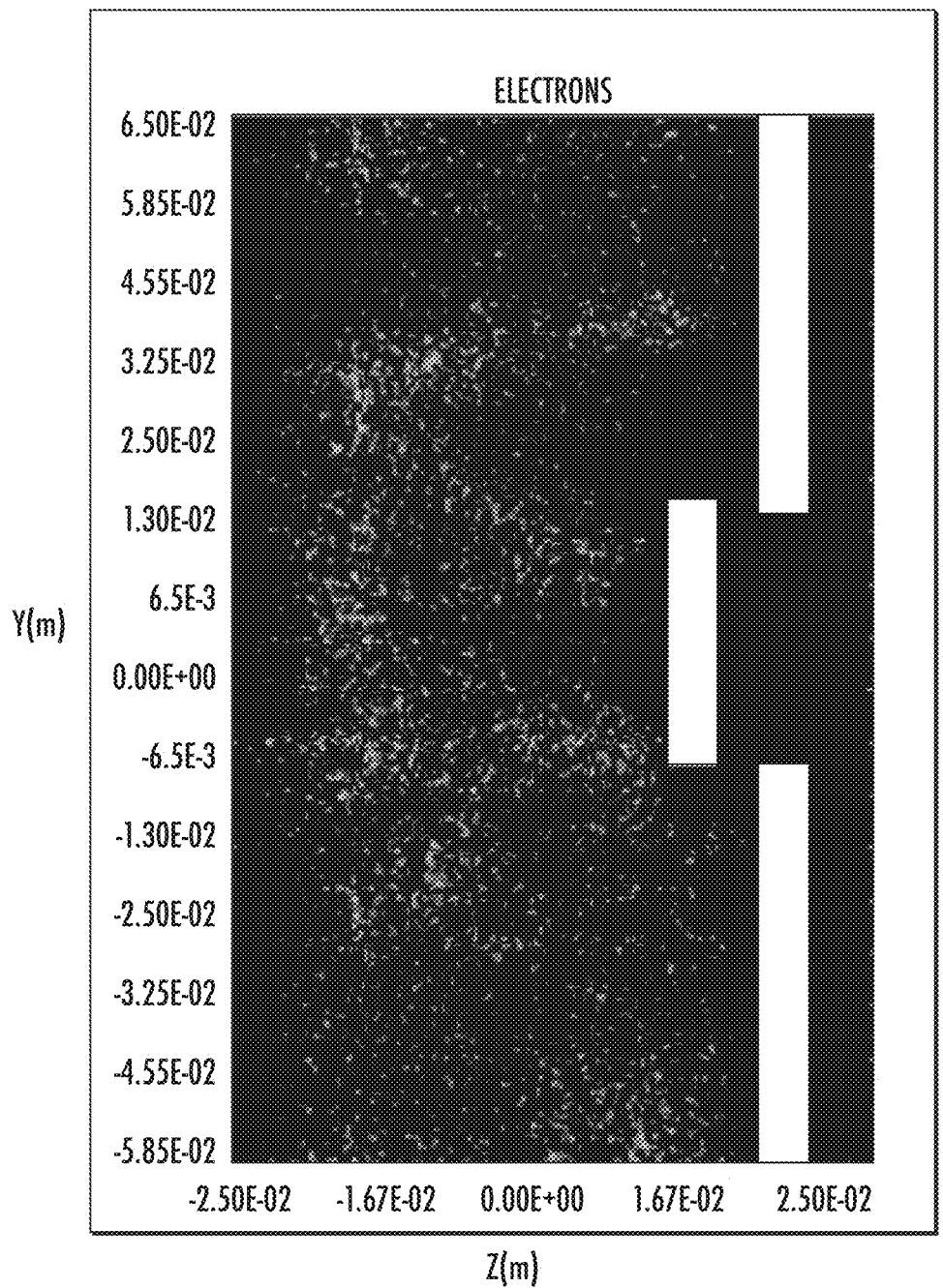
Figure 2D:
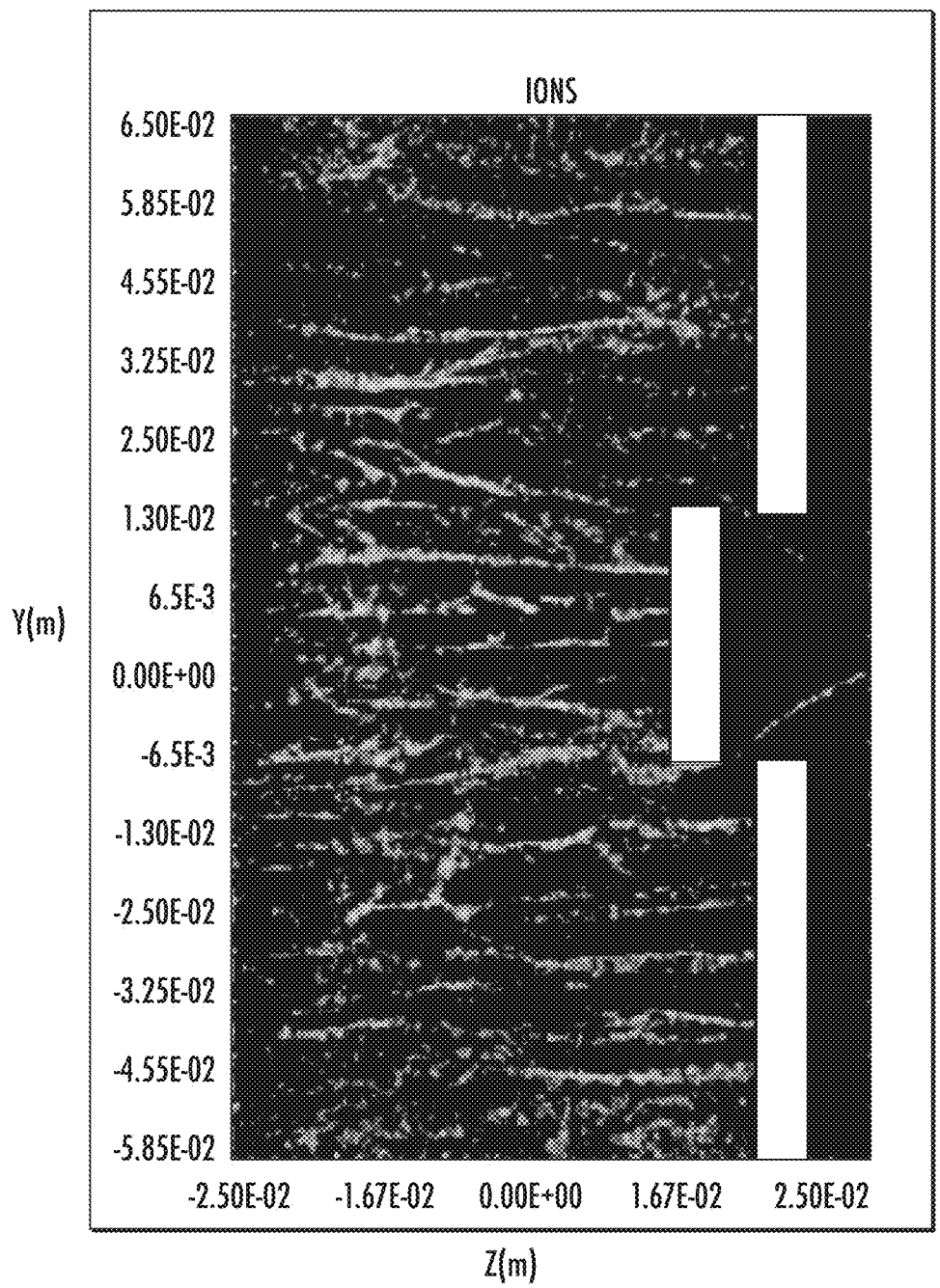

Turning now to FIGS. 2C and 2D, as the plasma sheath evolves with time, ions continue to arrive at the inner walls of the plasma plate and plasma blocker. In the absence of a path to ground, the ions will create an imbalance in the plasma density, which situation will lead to the formation of a ambipolar electric field. In this case equal fluxes of electrons and ions will be directed toward the inner walls $$\vec{\Gamma} = -D_a\vec{\nabla}n \quad (5)$$

where $\vec{\nabla}n$ is the gradient of plasma density in the direction perpendicular to faceplate and blocker walls (z direction) and Da is the ambipolar diffusion coefficient $$D_a = \frac{\mu_e D_i + \mu_i D_e}{\mu_e + \mu_i} \quad (6)$$

where $\mu_{e,i}$ and $D_{e,i}$ are mobilities and diffusion coefficients of electrons and ions, respectively. As a result of ambipolar diffusion, the sheath thickness decreases (collapses) until the point where plasma menisci are formed in the extraction slits and the ion beamlets start to be extracted. This decrease of the sheath thickness can be seen in FIGS. 2C and 2D, where the z-y phase space for electrons and ions at 4 μsec after commencing of the negative voltage pulse is shown. At this instance, ion beamlets are readily formed, extracted, and directed to the substrate position, as shown in FIG. 2D.

Thus, in accordance with various embodiments, the duty cycle and frequency of voltage pulses may be set to provide a duration for a given pulse exceeding the time required for plasma sheath collapse (plasma sheath collapse period) and the beginning of extraction of an ion beam. In the above example, assuming a minimum plasma sheath collapse period of 4 μsec, a pulse duration of 10 μs or greater may be appropriate to ensure proper extraction of an ion beam. At a 50% duty cycle this pulse duration equates to a pulse period of 20 μs or greater, meaning a voltage pulse frequency may be set at 50 kHz or lower to effectively extract ions in the scenario of FIGS. 2A-2D.

Figure 3A:
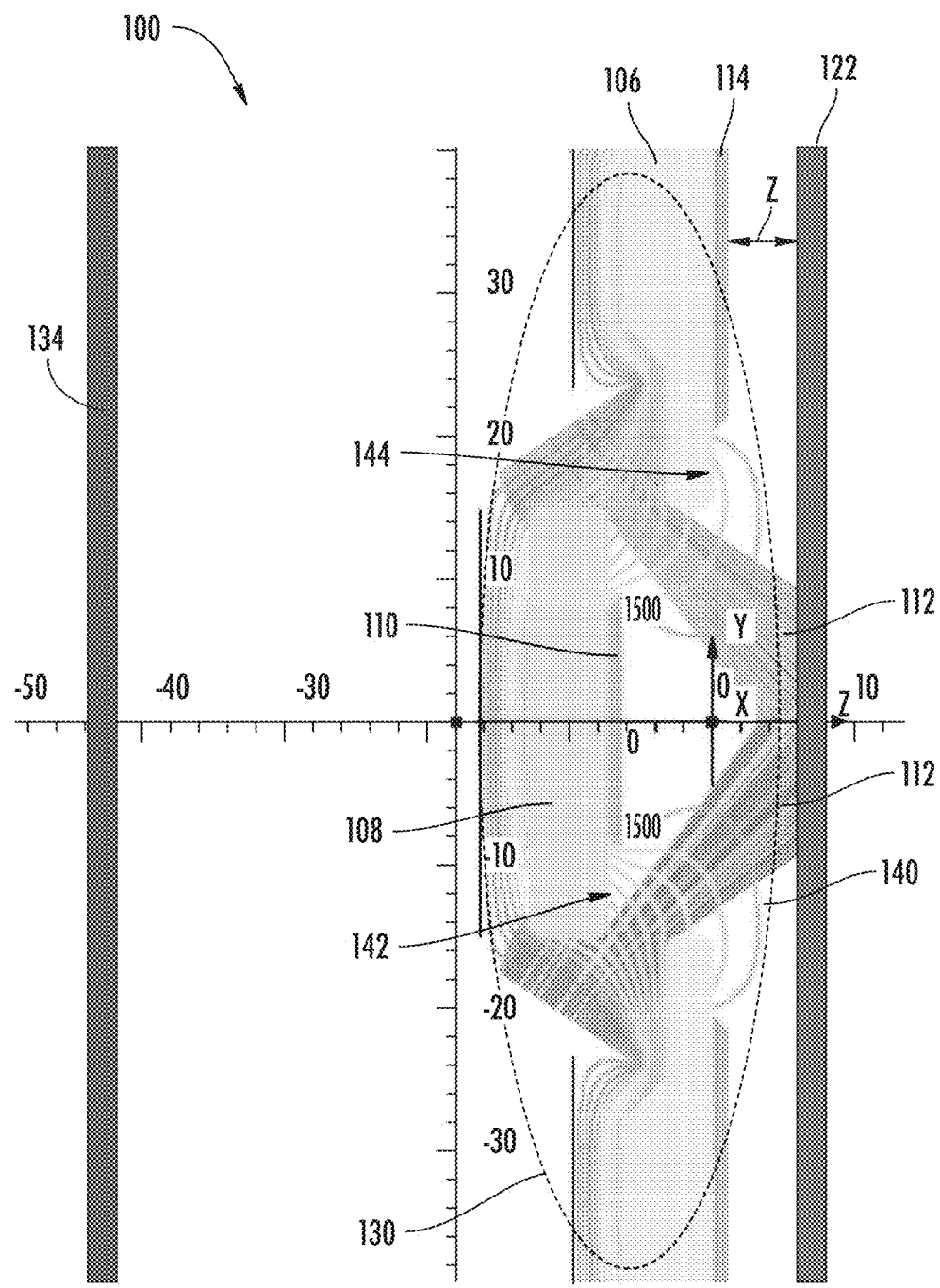
FIGS. 3A-3C depict operating scenarios for the processing apparatus arranged according to FIG. 1, and illustrate beamlets, shapes, and electrostatic potential distributions in the extraction area.
Figure 3B:
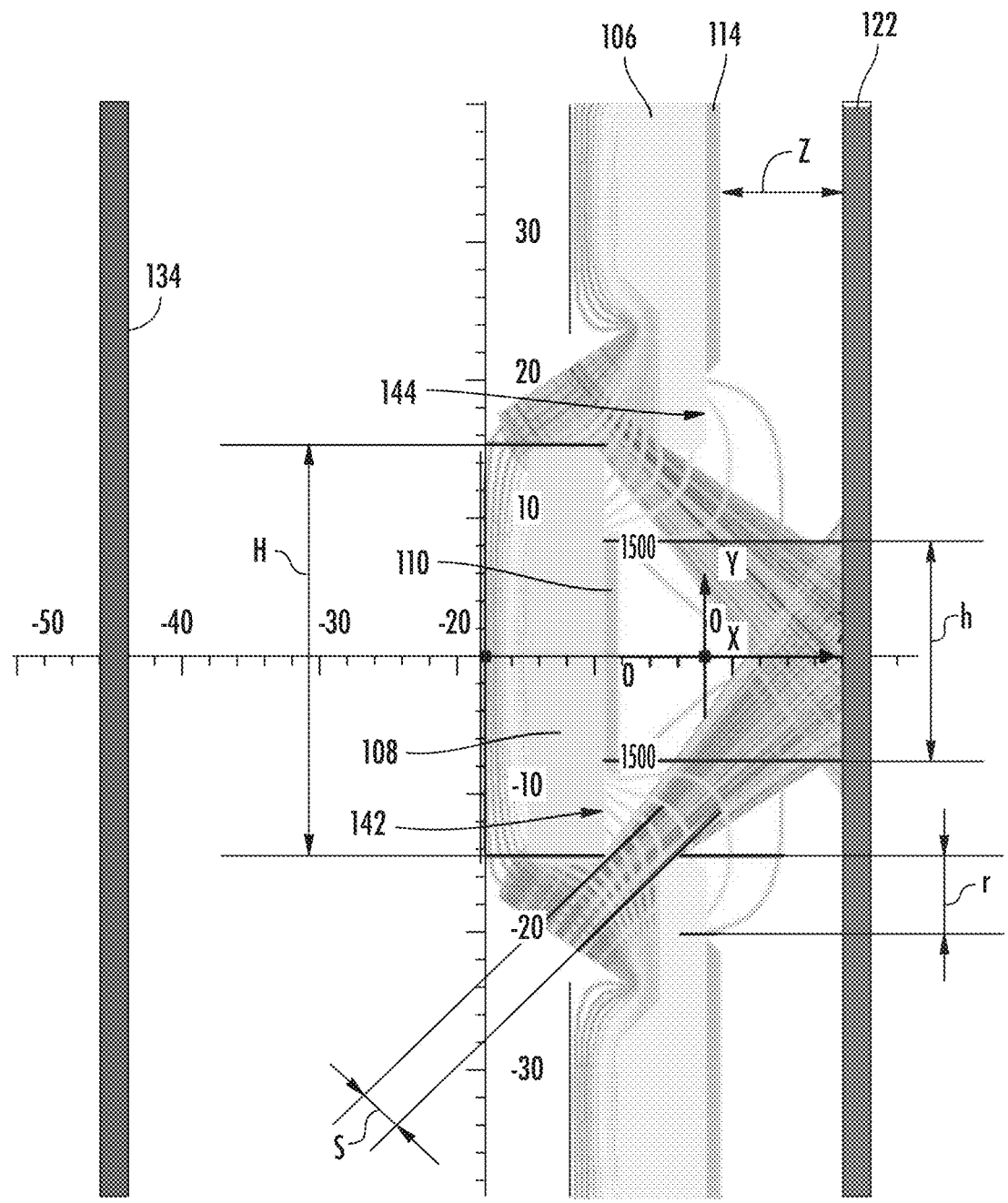
Figure 3C:
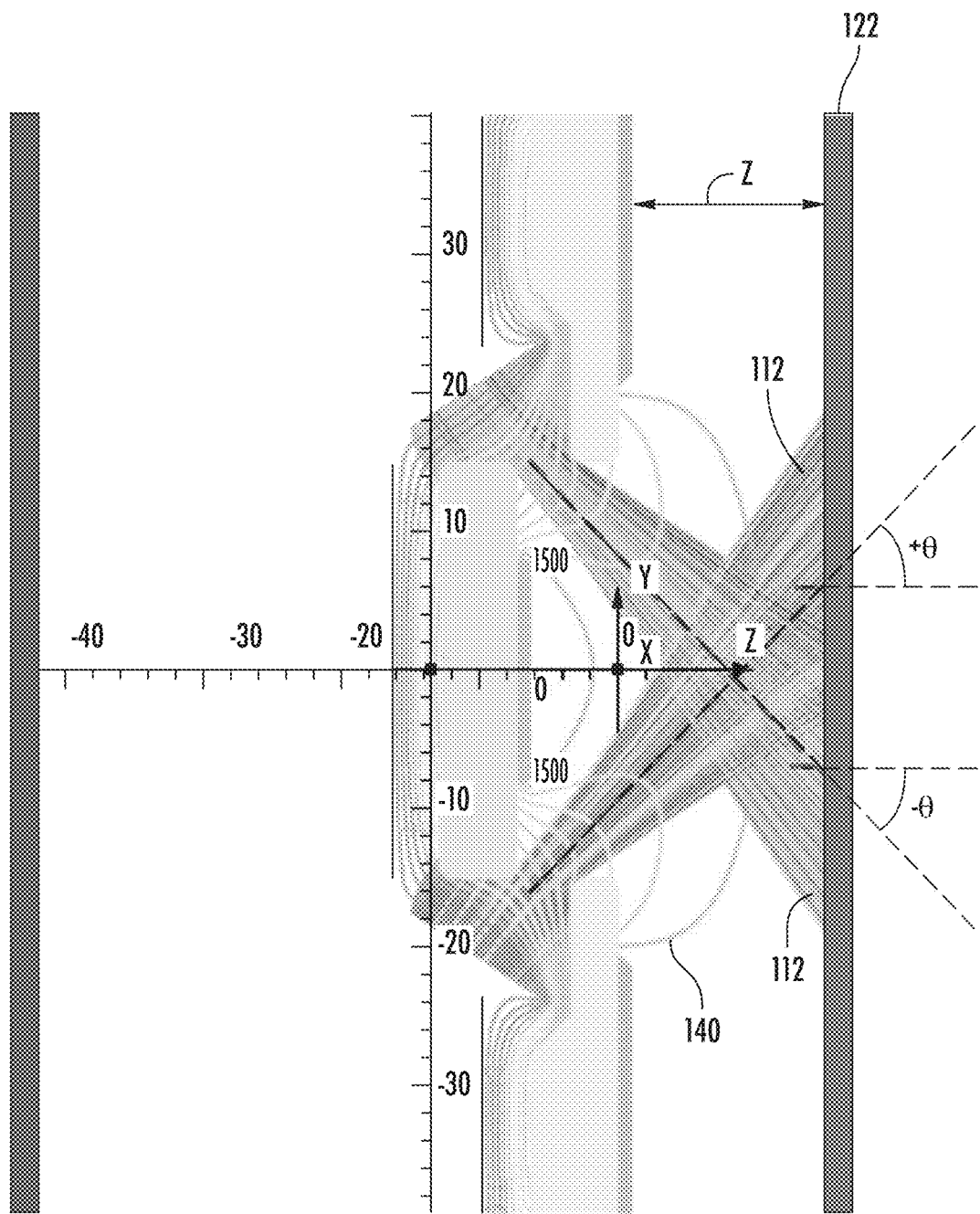

FIGS. 3A-3C depict operating scenarios for the processing system 100 described above and shown in FIG. 1, and illustrate beamlets, shapes, and electrostatic potential distributions in the extraction area (i.e., the area between the blocker electrode 110 and the substrate 122). More particularly, FIGS. 3A-3C depict the results of OPERA modeling showing the electrically conductive wall 134 of the plasma chamber 102, the plasma plate 106, the extraction electrode 114, the beam blocker 108, the blocker electrode 110, and the substrate 122. In the series of views presented, plasma density and biasing voltage are kept the same (600 W rf power and −1.5 kV), and the distance between the extraction electrode 114 and the substrate 122 in the z-direction is increased from 6 mm in FIG. 3A to 10 mm in FIG. 3B to 15 mm in FIG. 3C. As can be seen, the dielectric structures of the extraction assembly 130 are transparent to the electrostatic field potential 140 whereas the metallic structures are not. Thus, the electrostatic potential lines 140 extend through the outermost portions of the beam blocker 108 not covered by the blocker electrode 110 (hereinafter "uncovered portions 142"), such uncovered portions 142 having a height (H−h)/2 in the y-direction as shown in FIG. 3B. Similarly, the electrostatic potential lines 140 extend through the portions of the plasma plate 106 not covered by the extraction electrode 114 (hereinafter "uncovered portions 144"), such uncovered portions 144 having a height r in the y-direction as shown in FIG. 3B. Ion extracted through the opening s (see FIG. 3B) at a natural angle (given by the geometry of the extraction assembly 130) will diverge in a manner generally dictated by a ratio of the heights of the uncovered portions 142, 144, the biasing voltage, and, to a lesser extent, the ion beam current. As a result, and also due to the geometrical symmetry of the extraction assembly, the ion beamlets 112 will have ion angular distributions characterized by angles of +/−Θ (see FIG. 3C) with respect to normal on the plane of the substrate 122 (i.e., with respect to the Z-axis).

Figure 4A:
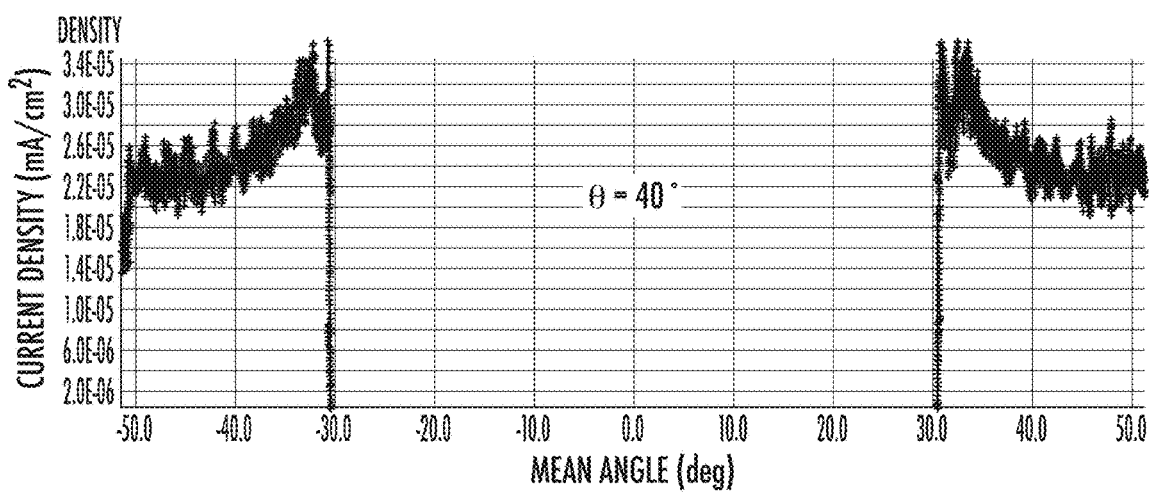
FIGS. 4A-4C depict graphs illustrating ion angular distributions for the scenarios depicted in FIGS. 3A-3C.
Figure 4B:
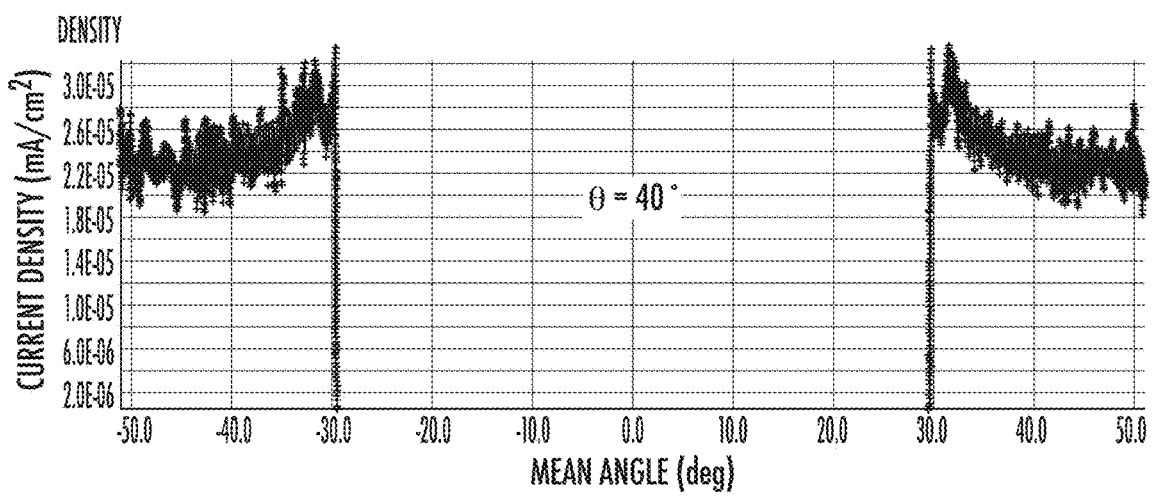
Figure 4C:
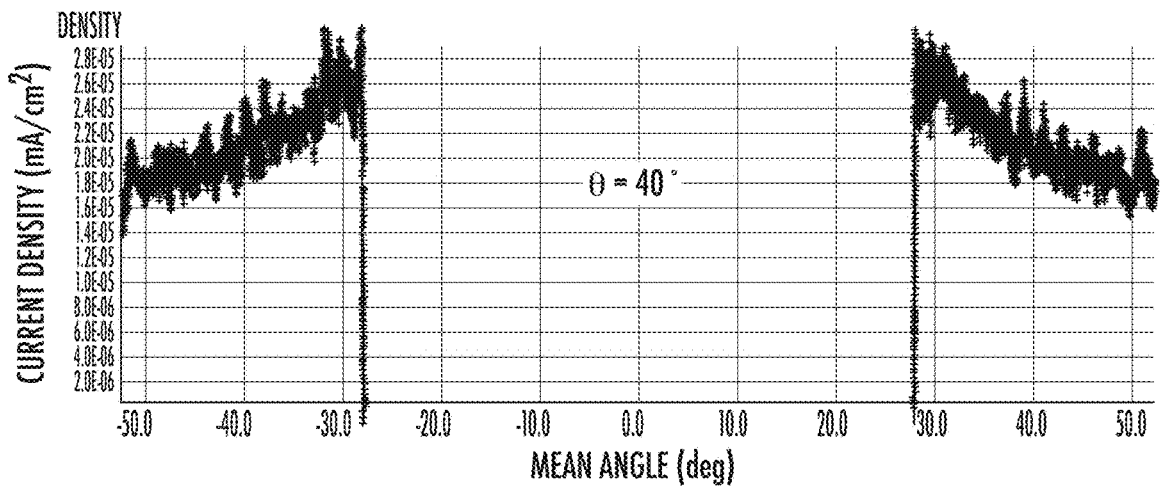

Ion angular distributions for the arrangements depicted in FIGS. 3A-3C are illustrated in the graphs shown in FIGS. 4A-4C, respectively. When the blocker electrode 110, the extraction electrode 114, and the substrate 122 are maintained at the same electrostatic potential the electric field between the ion source and the substrate 122 is concentrated almost entirely in the extraction slit region (see the distribution of the equipotential lines). Consequently, the ion angular distributions of the extracted ion beamlets 112 are not affected by the z gap length, and their characteristics are quasi-identical, having the same mean angle (40°) and a slightly increasing angular spread (10°, 11°, and 12°) as the distance between the extraction electrode 114 and the substrate 122 in the z-direction is increased from 6 mm to 10 mm, and from 10 mm to 15 mm, due to a small space charge effect. Thus, the substrate 122 can be moved away from the extraction assembly as necessary, such as to minimize contamination of the plasma chamber 102 with material etched from the substrate 122, while preserving the mean angle of the ion beamlets 112 relative to the substrate 122.

Figure 5:
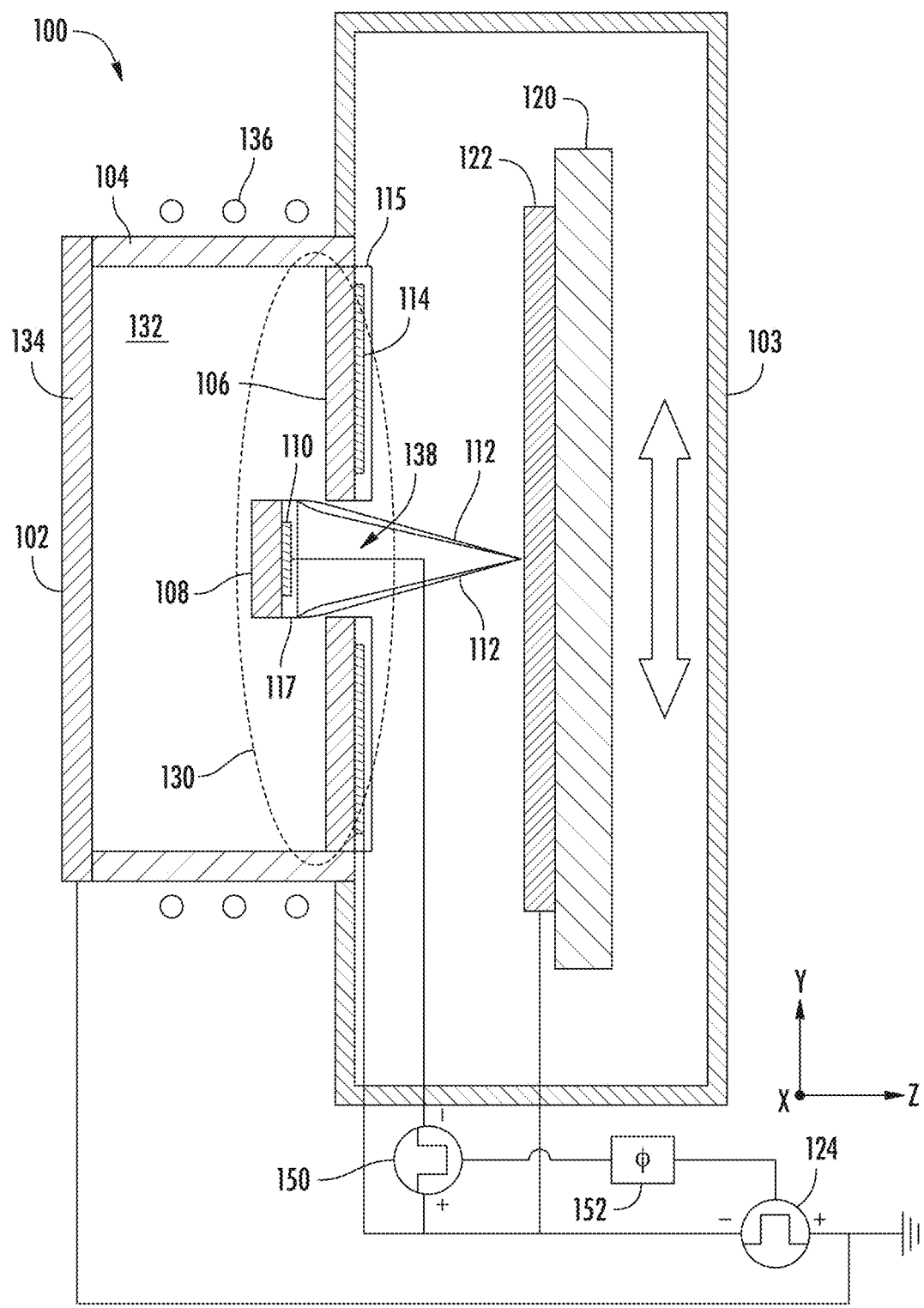
FIG. 5 presents a vertical cross-section of a processing apparatus consistent with another embodiment of this disclosure.

Referring now to FIG. 5, an alternative embodiment of processing system 100 is presented wherein a second pulsed voltage supply 150 is implemented (i.e., in addition to the pulsed voltage supply 124 described above, hereinafter referred to as "the first pulsed voltage supply 124"). The second pulsed voltage supply 150 may be coupled to the blocker electrode 110 for differentially biasing the blocker electrode 110 relative to the extraction electrode 114. The second pulsed voltage supply 150 may be bipolar to facilitate negative or positive biasing relative to the extraction electrode 114. A phase controller 152 may be connected between the first and second pulsed voltage supplies 124, 150 to ensure adequate phase is maintained therebetween.

FIGS. 6A-6F depict operating scenarios for the differentially biased embodiment of the processing system 100 shown in FIG. 5, and illustrate beamlets, shapes, and electrostatic potential distributions in the extraction area. More particularly, FIGS. 6A-6F depict the results of OPERA modeling showing the electrically conductive wall 134 of the plasma chamber 102, the plasma plate 106, the extraction electrode 114, the beam blocker 108, the blocker electrode 110, and the substrate 122. In the series of views presented, the plasma density, biasing voltage applied by the first pulsed voltage supply 124, and the distance between the extraction electrode 114 and the substrate 122 in the z-direction are all kept the same (600 W rf power, −1.5 kV, and 15 mm, respectively), while the biasing voltage applied to the blocker electrode 110 by the second pulsed voltage supply 150 is decreased in increments of 300V, from 1.8 kV in FIG. 6A to 300V in FIG. 6D. As can be seen, as the relative voltage bias is increased the distribution of the electrostatic potential lines 140 in the extraction slit area becomes less dense and more parallel (i.e., closer to parallel) toward the substrate. As a result, the angular spread and on-substrate footprint of the beamlets 112 shrinks.

Figures 6A, 6B, 6C, 6D, 6E, 6F:
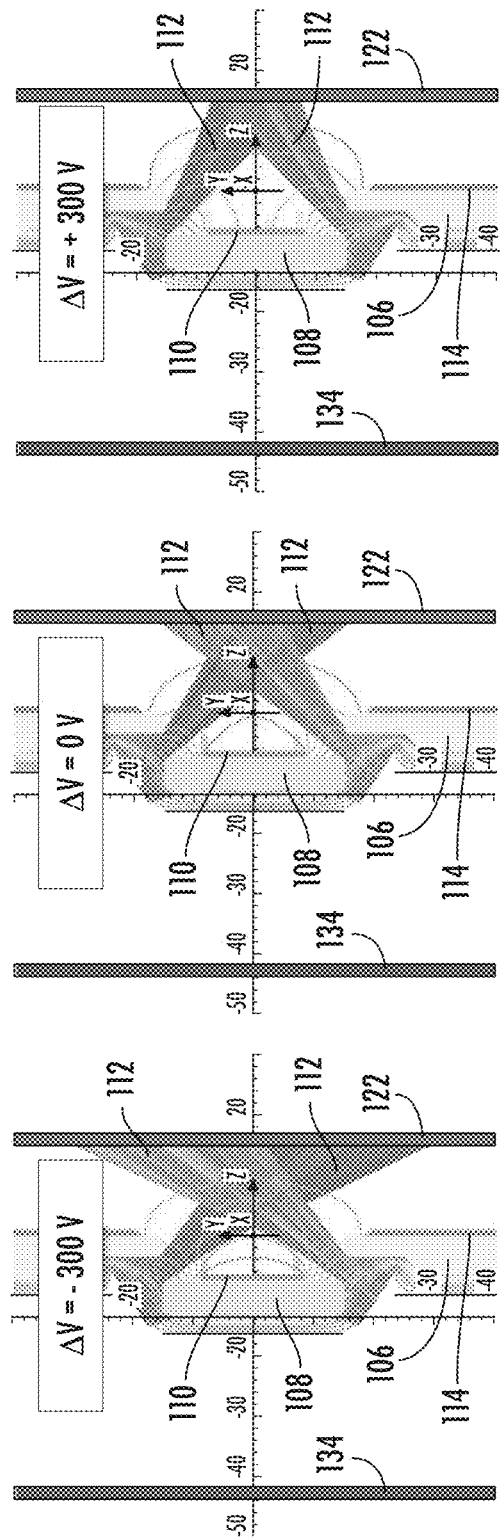
FIGS. 6A-6F depict operating scenarios for the processing apparatus arranged according to FIG. 5, and illustrate beamlets, shapes, and electrostatic potential distributions in the extraction area.
Figure 7A:
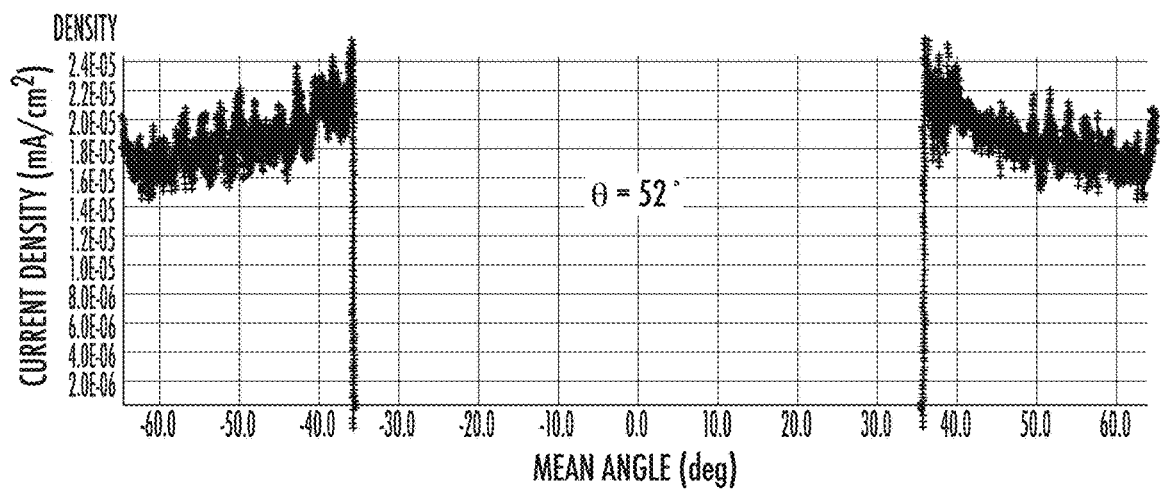
FIGS. 7A-7F depict graphs illustrating ion angular distributions for the scenarios depicted in FIGS. 6A-6F.
Figure 7B:
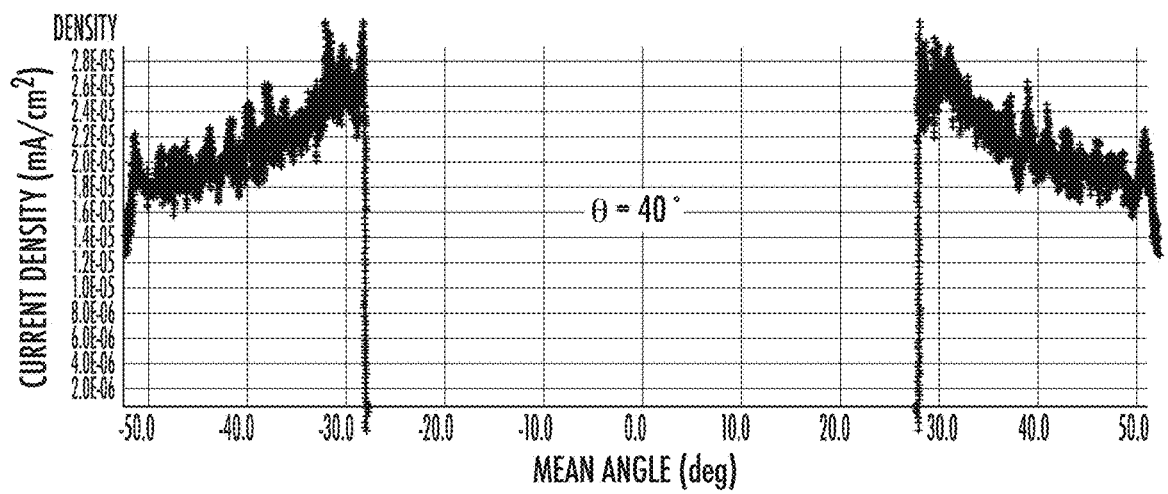
Figure 7C:
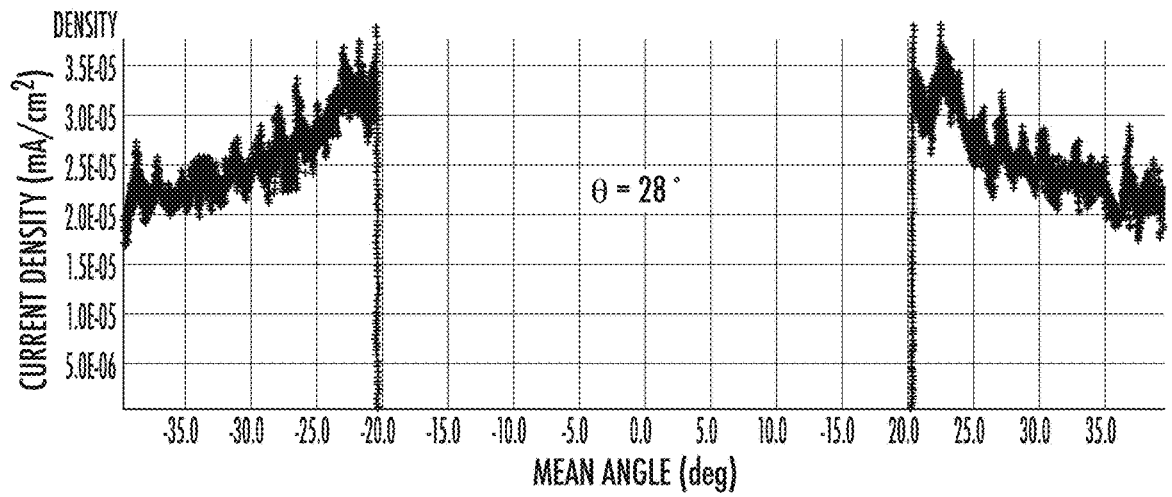
Figure 7D:
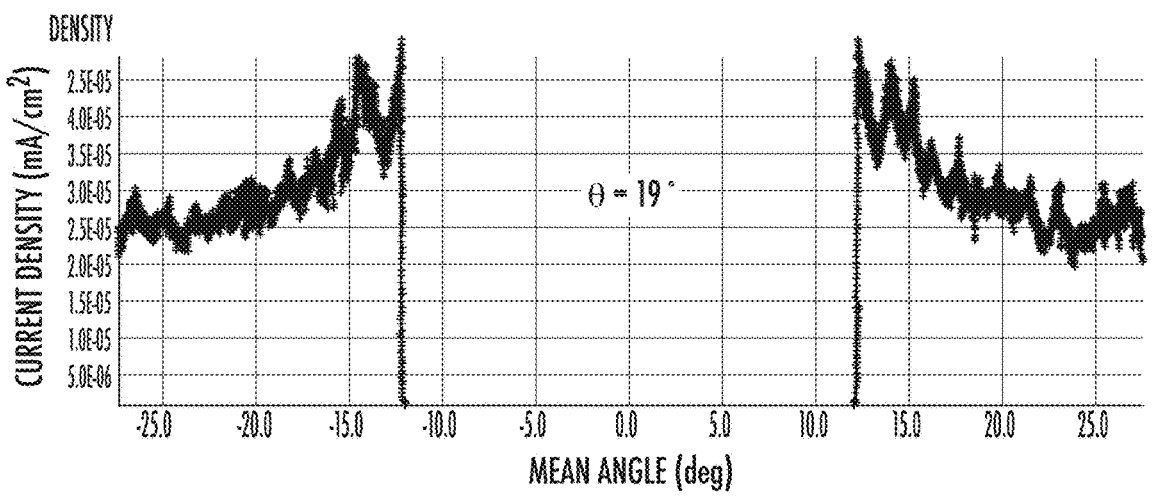
Figure 7E:
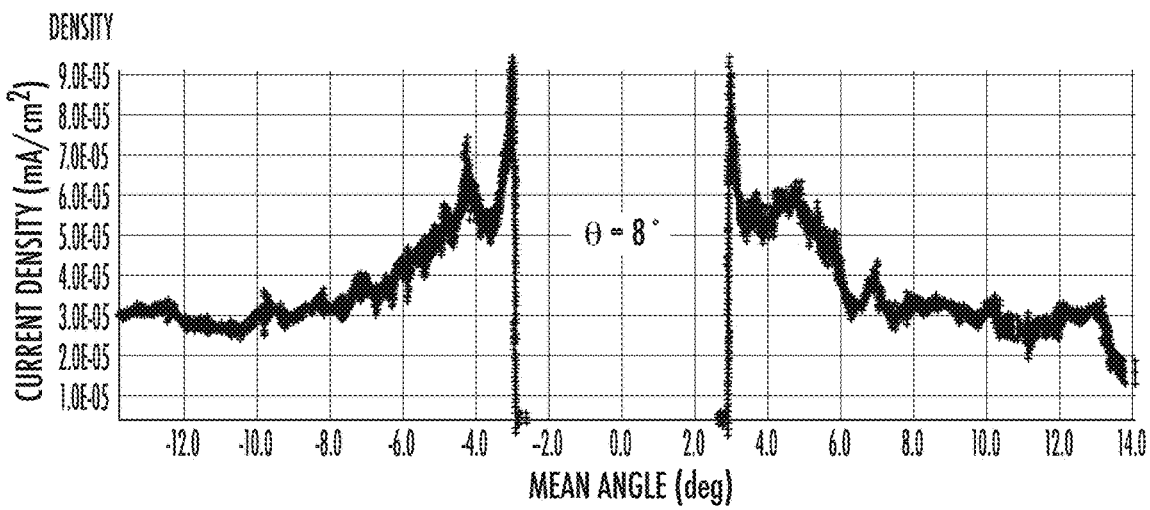
Figure 7F:
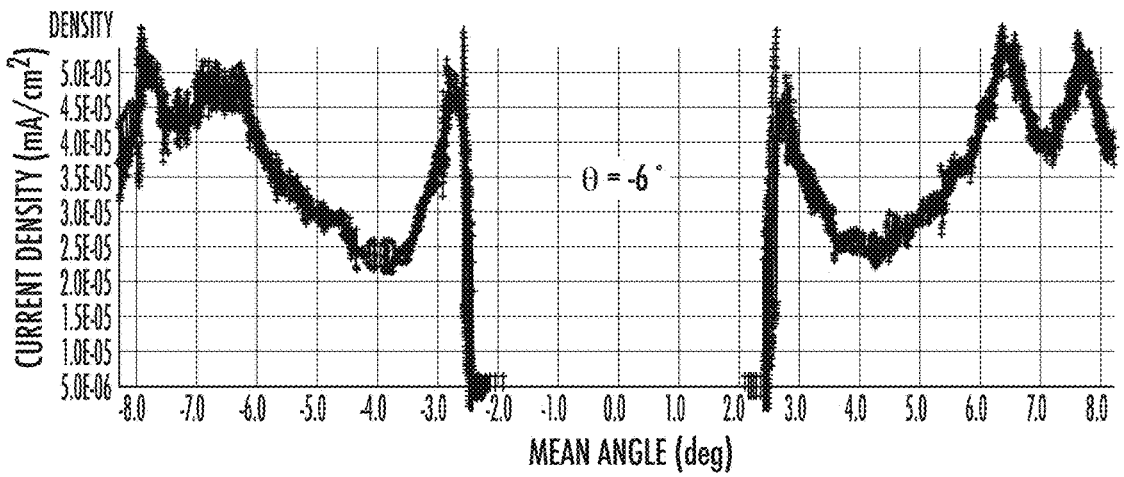

Ion angular distributions for the arrangements depicted in FIGS. 6A-6F are illustrated in the graphs shown in FIGS. 7A-7F, respectively. As a result of the differential biasing applied to the blocker electrode 110, the mean angle of the ion beamlets 112 with respect to normal on the plane of the substrate 122 (i.e., with respect to the Z-axis) may decrease from 52° in FIG. 7A to 8° in FIG. 7E, whereafter the mean angle may go past normal to −6° in FIG. 7F. Thus, the disclosed arrangement facilitates a tunability range of nearly 60°. Additionally, the angular spread of the beamlets 112 may decrease from 15° at ΔV=−300V (FIGS. 6A and 7A) to 2.8° at ΔV=1200V (FIGS. 6F and 7F).

Figure 8A:
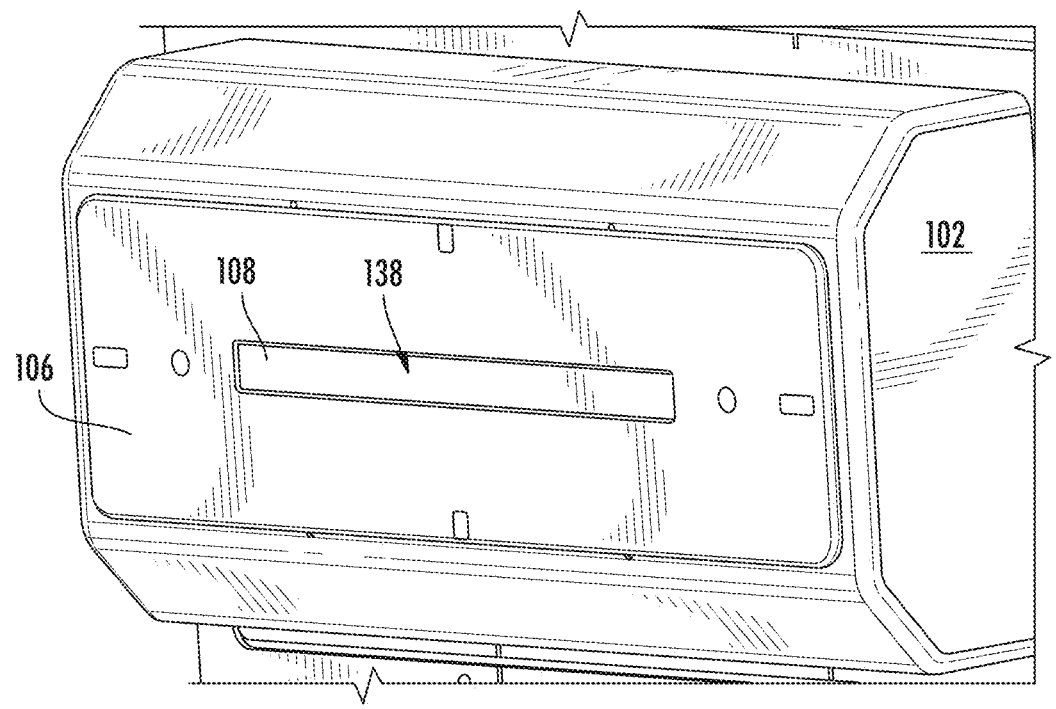
FIGS. 8A and 8B are a perspective view and an exploded view illustrating the plasma chamber and the extraction assembly of a processing apparatus consistent with embodiments of this disclosure.
Figure 8B:
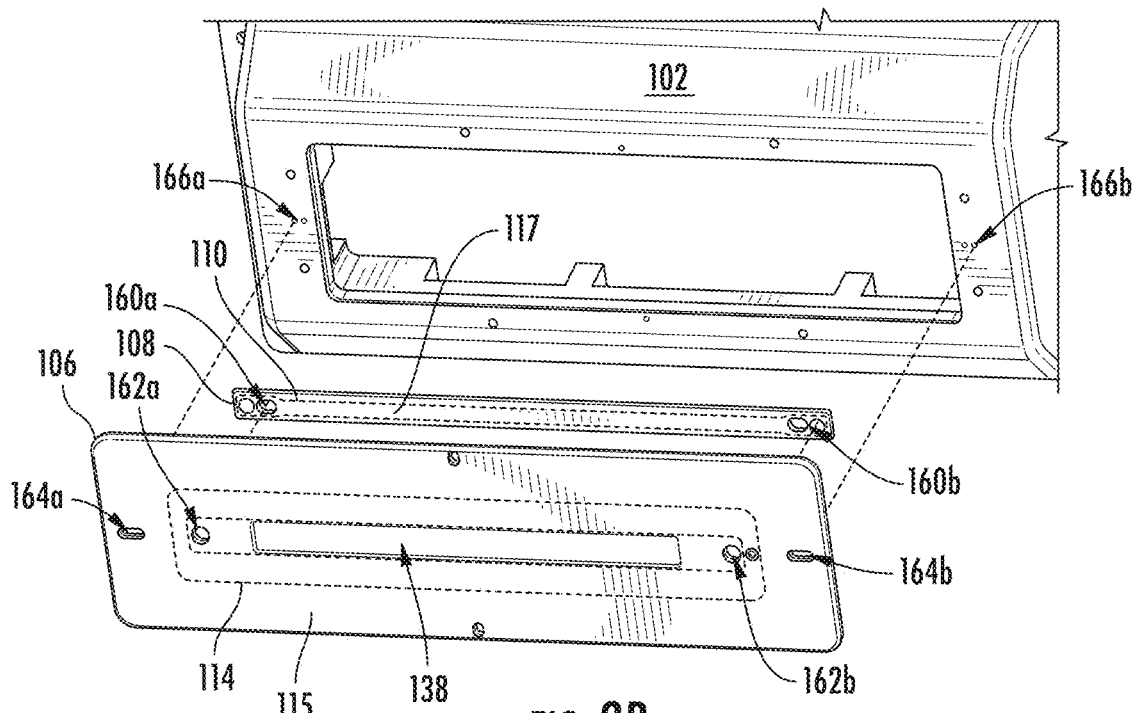

FIGS. 8A and 8B illustrate a portion of the processing system 100, including a perspective view and an exploded view, respectively, of the plasma chamber 102 and the extraction assembly 130 described above. The extraction assembly 130 may include the plasma plate 106 and the beam blocker 108, wherein the beam blocker 108 may extend across a rear of the extraction aperture 138 and may be fastened to a rear surface of the plasma plate 106, such as by mechanical fasteners (not shown) extending through respective mounting holes 160a, 160b and 162a, 162b formed in the beam blocker 108 and the plasma plate 106. The plasma plate 106 may cover an open front of the plasma chamber 102 and may be fastened to a front surface of the plasma chamber 102, such as by mechanical fasteners (not shown) extending through respective mounting holes 164a, 164b and 166a, 166b formed in the plasma plate 106 and the plasma chamber 102. The extraction electrode 114, being disposed on a front surface of the plasma plate 106 and surrounding the extraction aperture 138, may be covered by the first dielectric coating 115 and is thus indicated by a dashed outline in FIG. 8B. The blocker electrode 110, being disposed on a front surface of the beam blocker 108, is covered by the second dielectric coating 117 and is thus indicated by a dashed outline in FIG. 8B.

Figure 9A:
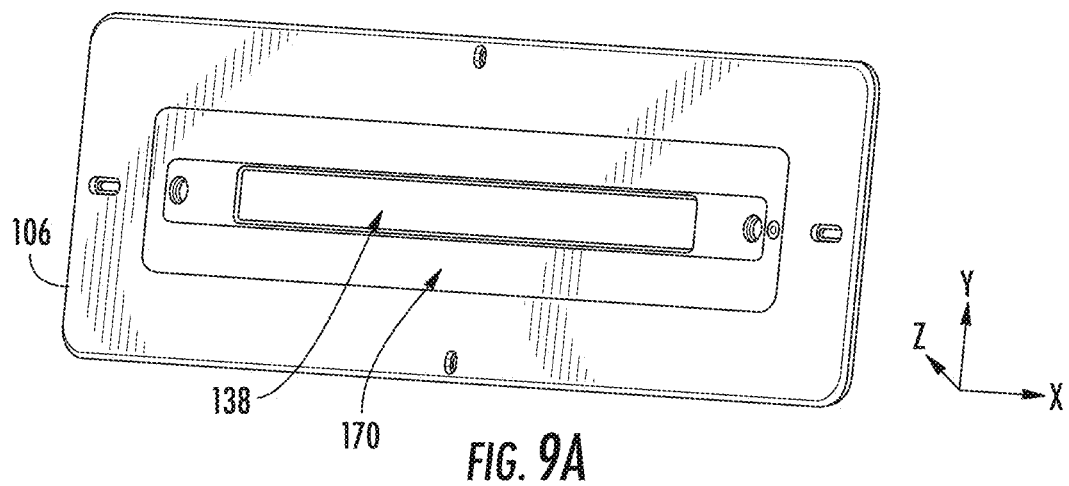
FIGS. 9A-9C are a series of perspective views illustrating a method of manufacturing the plasma plate, extraction electrode, and first dielectric coating of a processing apparatus consistent with embodiments of this disclosure.
Figure 9B:
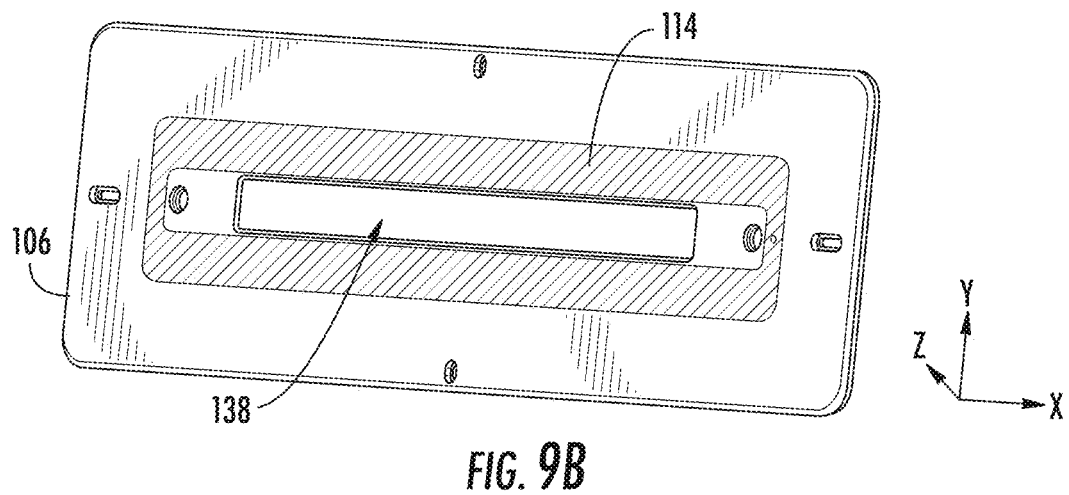
Figure 9C:
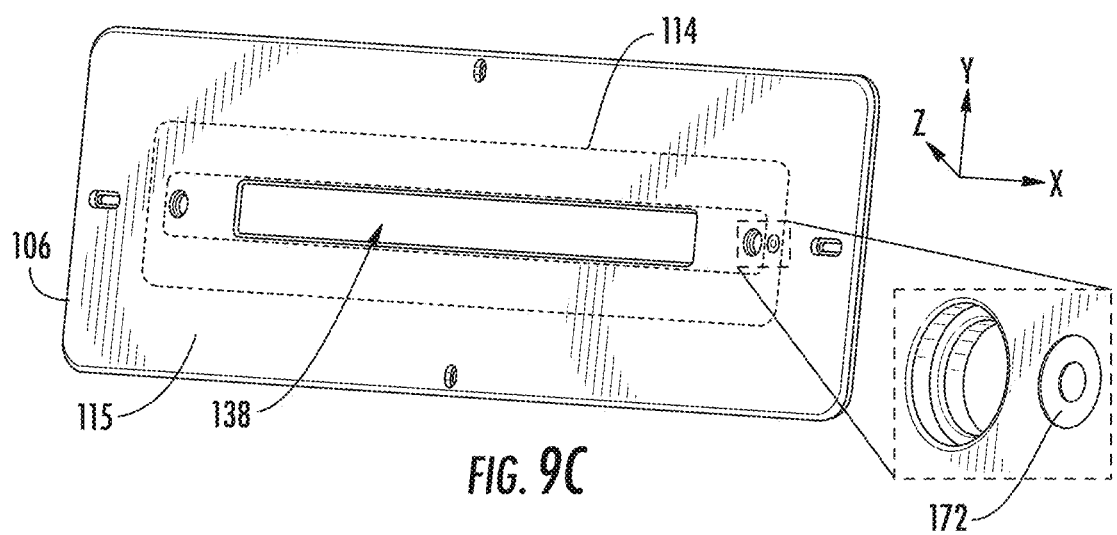
Figure 10:
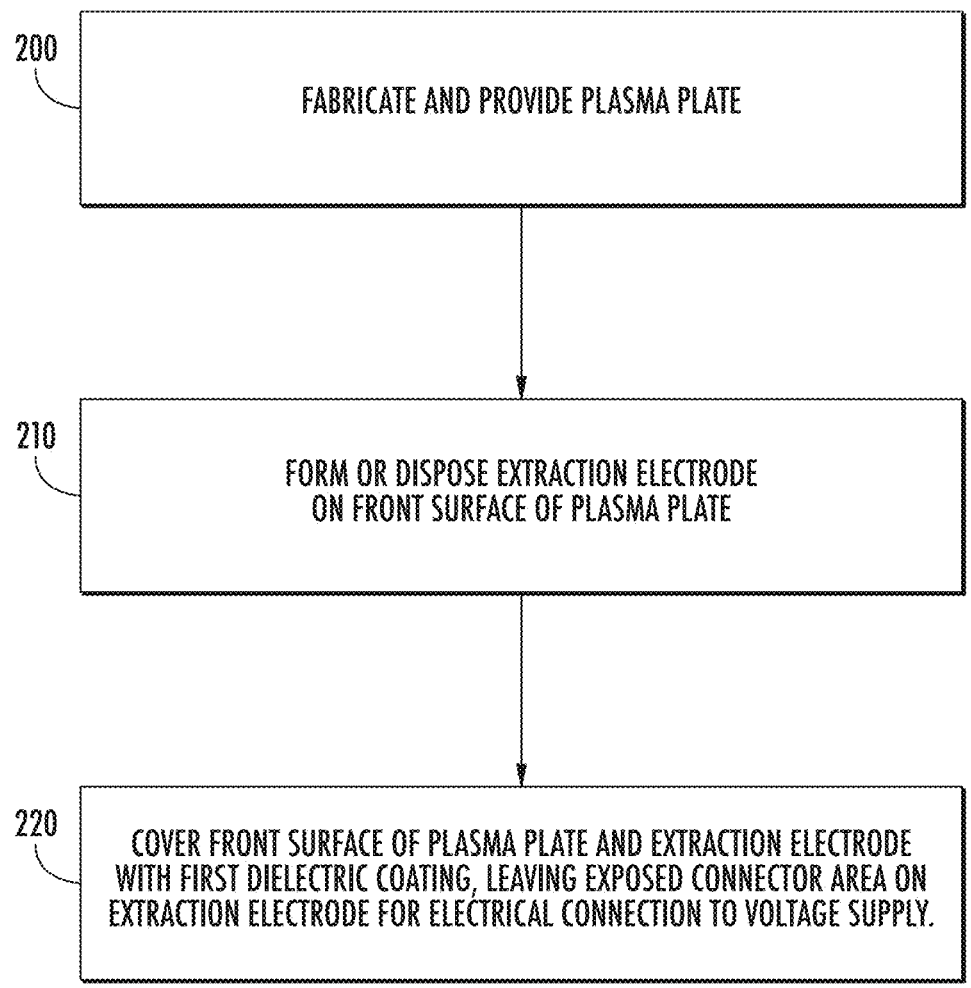
FIG. 10 is a flow diagram illustrating the method set forth in FIGS. 9A-9C.

FIGS. 9A-9C are a series of perspective views illustrating a method of manufacturing the plasma plate assembly of the extraction assembly 130. FIG. 10 is a flow diagram illustrating the same method. Referring to FIG. 9A and to block 200 in FIG. 10, the plasma plate 106 may be fabricated and provided. In various examples, the plasma plate 106 may be machined from a plate of an electrically insulating material, such as $Al_2O_3$ (alumina), quartz, AlN, or other suitable electrical insulator. The present disclosure is not limited in this regard. The plasma plate 106 may define the extraction aperture 138 elongated along the X-axis of the Cartesian coordinate system shown. Optionally, a recess or pocket 170 may be formed (e.g., machined) in the front surface of the plasma plate 106, the recess 170 having a size and a shape adapted to accommodate the extraction electrode 114a further described below. In a non-limiting example, the recess 170 may have a depth in a range of 0.2 millimeters to 0.3 millimeters as measured along the Z-axis.

Referring to FIG. 9B and to block 210 in FIG. 10, the extraction electrode 114 may be formed or disposed on the front surface of the plasma plate 106, surrounding the extraction aperture 138. In various examples, the extraction electrode 114 may be formed of an electrically conductive material, such as aluminum, nickel, titanium, copper, molybdenum, tungsten, or doped silicon, and may be printed, sprayed, or adhered onto the front surface of the plasma plate 106. In a non-limiting example, the extraction electrode 114 may have a thickness in a range of 0.2 millimeters to 0.3 millimeters as measured along the Z-axis. If a recess 170 is formed in the front surface of the plasma plate 106 as described above (see FIG. 9A), the recess 170 may be filled with the electrically conductive material, such as by spraying the material into the recess 170, to form the extraction electrode 114.

Referring to FIG. 9C and to block 220 in FIG. 10, the first dielectric coating 115 may be applied to the plasma plate 106 and extraction electrode 114. The first dielectric coating 115 may cover the front surface of the plasma plate 106 and the extraction electrode 114. In various embodiments, the first dielectric coating 115 may be formed of a chemically inert, dielectric material, such as $Al_2O_3$, $Y_2O_3$, $ZrO_2$, or combinations thereof, and may be applied using a plasma spray process. The present disclosure is not limited in this regard. A small portion of the extraction electrode 114 may be masked during the application of the first dielectric coating 115 to provide an exposed connector area 172, uncovered by the first dielectric coating 115, for facilitating electrical connection of the extraction electrode 114 to the first pulsed voltage supply 124 described above, for example.

Figure 11A:
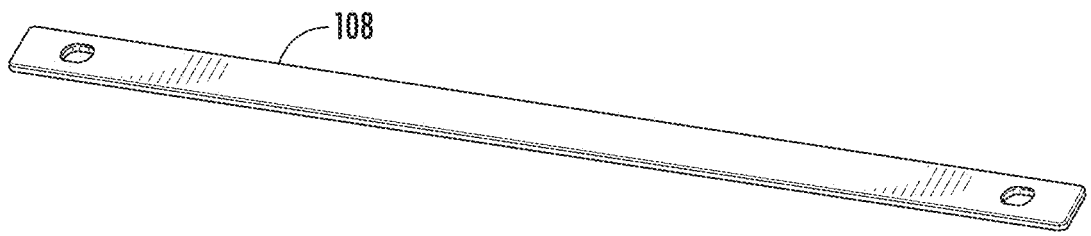
FIGS. 11A-11C are a series of perspective views illustrating a method of manufacturing the beam blocker, blocker electrode, and second dielectric coating of a processing apparatus consistent with embodiments of this disclosure.
Figure 11B:
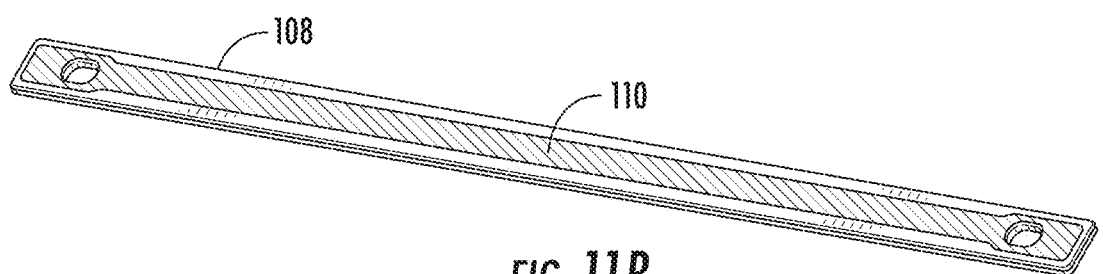
Figure 11C:
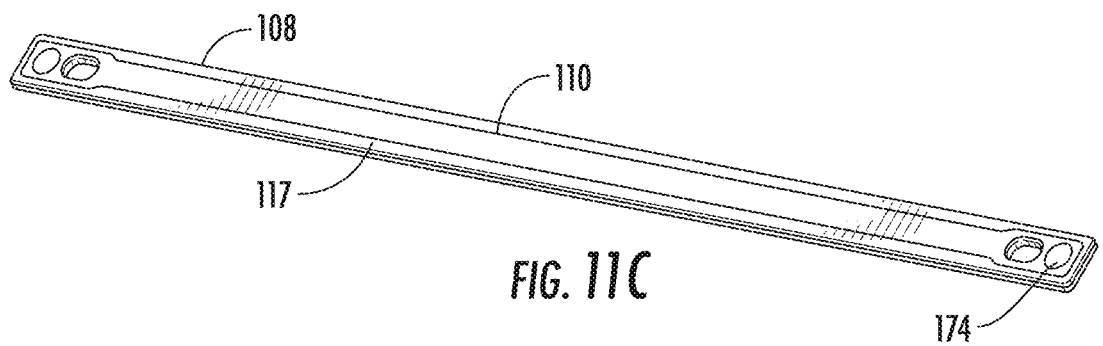
Figure 12:
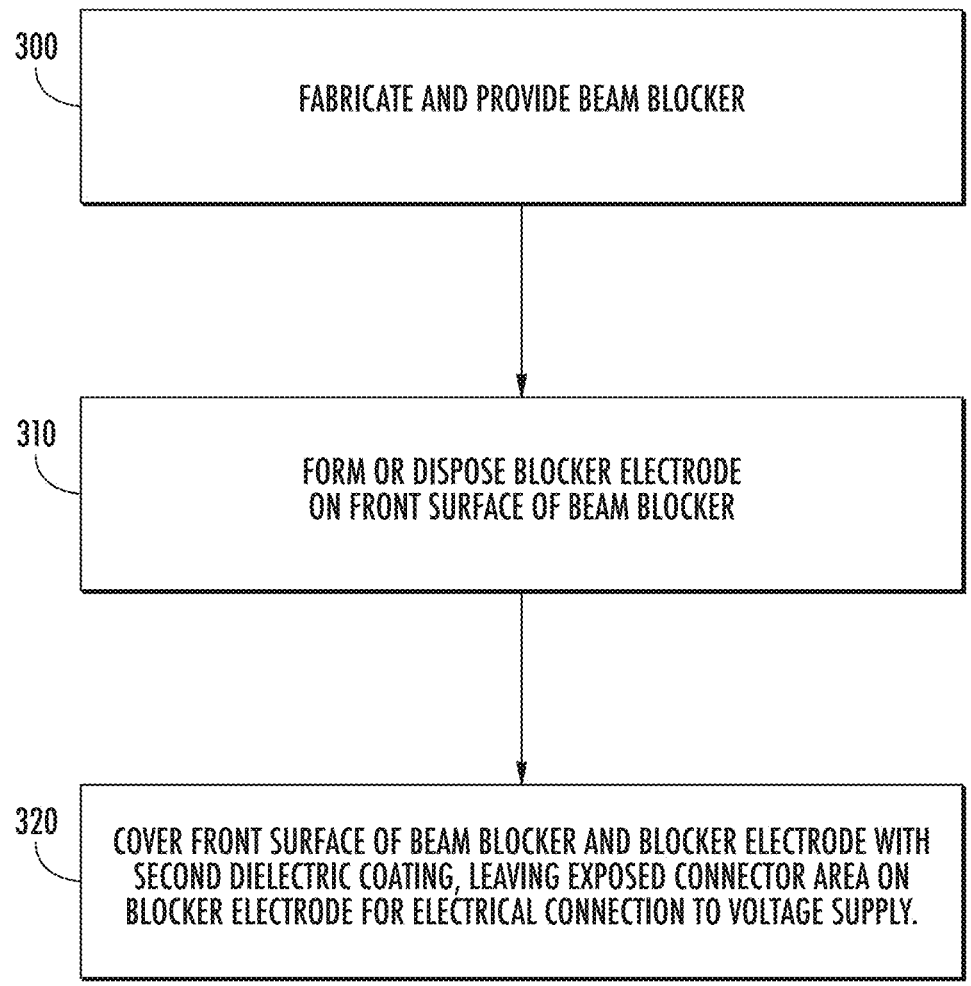
FIG. 12 is a flow diagram illustrating the method set forth in FIGS. 11A-11C.

FIGS. 11A-11C are a series of perspective views illustrating a method of manufacturing the blocker assembly of the extraction assembly 130. FIG. 12 is a flow diagram illustrating the same method. Referring to FIG. 11A and to block 300 in FIG. 12, the beam blocker 108 may be fabricated and provided. In various examples, the beam blocker 108 may be machined from a plate of an electrically insulating material, such as Al2O3 (alumina), quartz, AlN, or other suitable electrical insulator. The present disclosure is not limited in this regard. The beam blocker 108 may be elongated along the X-axis of the Cartesian coordinate system shown.

Referring to FIG. 11B and to block 310 in FIG. 10, the blocker electrode 110 may be formed or disposed on the front surface of the beam blocker 108. In various examples, the blocker electrode 110 may be formed of an electrically conductive material, such as aluminum, nickel, titanium, copper, molybdenum, tungsten, or doped silicon, and may be printed, sprayed, or adhered onto the front surface of the beam blocker 108. In a non-limiting example, the blocker electrode 110 may have a thickness in a range of 0.2 millimeters to 0.3 millimeters as measured along the Z-axis.

Referring to FIG. 11C and to block 320 in FIG. 12, the second dielectric coating 117 may be applied to the beam blocker 108 and blocker electrode 110. The second dielectric coating 117 may cover the front surface of the beam blocker 108 and the blocker electrode 110. In various embodiments, the second dielectric coating 117 may be formed of a chemically inert, dielectric material, such as $Al_2O_3$, $Y_2O_3$, $ZrO_2$, or combinations thereof, and may be applied using a plasma spray process. The present disclosure is not limited in this regard. A small portion of the blocker electrode 110 may be masked during the application of the second dielectric coating 117 to provide an exposed connector area 174, uncovered by the second dielectric coating 117, for facilitating electrical connection of the blocker electrode 110 to the pulsed voltage supply 124 (or second pulsed voltage supply 150) described above, for example.

The present embodiments provide numerous advantages in the art. A first advantage is found in an extraction assembly having a novel combination of low profile, electrically conductive electrodes fully covered by dielectric material, thus facilitating extraction of ion beamlets having high on-wafer incidence angles (>30° mean angle) while mitigating metal contamination. A further advantage is the ability to control ion angular distribution in real time. A further advantage is the ability to reduce plasma chamber contamination by material sputtered and/or chemically etched from a substrate by allowing the substrate to be distanced from the plasma chamber while preserving on-wafer incidence angles of ion beamlets. Furthermore, for compact ion beam systems, the substrate is removed from the extraction assembly configuration, while maintaining a simple diode electrostatic extraction process. A further advantage is the use of the same power supply to simultaneously bias the substrate and the biasable electrodes, simplifying cost and design complexity. A further example of advantages of the present embodiments is the ability to use a simple low voltage power supply floating on a high voltage power supply to provide differential biasing to a blocker electrode with respect to an extraction electrode and substrate.

The present disclosure is not to be limited in scope by the specific embodiments described herein. Indeed, other various embodiments of, and modifications to, the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize its usefulness is not limited thereto and the present disclosure may be beneficially implemented in any number of environments for any number of purposes. Thus, the claims set forth below should be construed in view of the full breadth and spirit of the present disclosure as described herein.

What is claimed is:

1. An ion beam processing system comprising:
   a plasma chamber;
   a plasma plate, disposed alongside the plasma chamber, the plasma plate defining an extraction aperture;
   a beam blocker, disposed within the plasma chamber and facing the extraction aperture;
   a blocker electrode, disposed on a surface of the beam blocker outside of the plasma chamber; and
   an extraction electrode disposed on a surface of the plasma plate outside of the plasma chamber;
   wherein the plasma plate is formed of an electrically insulating material, and the beam blocker is formed of an electrically insulating material.

2. The ion beam processing system of claim 1, wherein the blocker electrode is formed of an electrically conductive material and is covered by a first dielectric coating, and wherein the extraction electrode is formed of an electrically conductive material and is covered by a second dielectric coating.

3. The ion beam processing system of claim 2, wherein a portion of the blocker electrode is not covered by the first dielectric coating for facilitating electrical connection of the blocker electrode to a pulsed voltage supply.

4. The ion beam processing system of claim 2, wherein a portion of the extraction electrode is not covered by the second dielectric coating for facilitating electrical connection of the extraction electrode to a pulsed voltage supply.

5. The ion beam processing system of claim 1, wherein the blocker electrode is planar and has a thickness measured in a direction perpendicular to a front surface of the beam blocker, wherein the thickness is less than 1 millimeter.

6. The ion beam processing system of claim 1, wherein the extraction electrode is planar and has a thickness measured in a direction perpendicular to a front surface of the plasma plate, wherein the thickness is less than 1 millimeter.

7. The ion beam processing system of claim 1, wherein an outermost edge of the blocker electrode is recessed relative to an outermost edge of the beam blocker in a direction parallel to a front surface of the beam blocker.

8. The ion beam processing system of claim 1, wherein an outermost edge of the extraction electrode is recessed relative to an edge of the plasma plate bounding the extraction aperture in a direction parallel to a front surface of the plasma plate.

9. The ion beam processing system of claim 1, further comprising a pulsed voltage supply electrically coupled to the plasma chamber and the extraction electrode to generate a bias voltage between the extraction electrode and the plasma chamber.

10. The ion beam processing system of claim 9, the pulsed voltage supply having a pulse component, to generate a pulsed bias voltage between the extraction electrode and the plasma chamber.

11. The ion beam processing system of claim 9, further comprising a process chamber to house a substrate, the pulsed voltage supply being electrically coupled on a first side to the plasma chamber and being electrically coupled on a second side to the extraction electrode, the blocker electrode, and the substrate.

12. The ion beam processing system of claim 9, wherein the pulsed voltage supply is a first pulsed voltage supply, the ion beam processing system further comprising a second pulsed voltage supply electrically coupled to the blocker electrode for differentially biasing the blocker electrode relative to the extraction electrode.

13. An ion beam processing system comprising:
a plasma chamber;
a plasma plate formed of an electrically insulating material, disposed alongside the plasma chamber, the plasma plate defining an extraction aperture;
a beam blocker formed of an electrically insulating material, disposed within the plasma chamber and facing the extraction aperture;
a blocker electrode formed of an electrically conductive material and covered by a first dielectric coating, disposed on a surface of the beam blocker outside of the plasma chamber, wherein the blocker electrode is planar and has a thickness measured in a direction perpendicular to a front surface of the beam blocker, wherein the thickness of the blocker electrode is less than 1 millimeter;
an extraction electrode formed of an electrically conductive material and covered by a first dielectric coating, disposed on a surface of the plasma plate outside of the plasma chamber, wherein the extraction electrode is planar and has a thickness measured in a direction perpendicular to a front surface of the plasma plate, wherein the thickness of the extraction electrode is less than 1 millimeter; and
a pulsed voltage supply electrically coupled to the plasma chamber and the extraction electrode to generate a bias voltage between the extraction electrode and the plasma chamber.

* * * * *